United States Patent
Furuta et al.

(10) Patent No.: US 9,431,595 B2
(45) Date of Patent: Aug. 30, 2016

(54) VIBRATION WAVE DRIVING DEVICE, IMAGE PICKUP DEVICE, OPTICAL APPARATUS, LIQUID DISCHARGE DEVICE, AND ELECTRONIC APPARATUS

(71) Applicant: CANON KABUSHIKI KAISHA, Tokyo (JP)

(72) Inventors: Tatsuo Furuta, Machida (JP); Hiroshi Saito, Kawasaki (JP); Shinya Koyama, Tokyo (JP); Akira Uebayashi, Tokyo (JP); Hidenori Tanaka, Yokohama (JP); Takeshi Kawano, Utsunomiya (JP); Yoshihiko Matsumura, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/653,803

(22) PCT Filed: Dec. 16, 2013

(86) PCT No.: PCT/JP2013/084391
§ 371 (c)(1),
(2) Date: Jun. 18, 2015

(87) PCT Pub. No.: WO2014/098244
PCT Pub. Date: Jun. 26, 2014

(65) Prior Publication Data
US 2015/0349236 A1 Dec. 3, 2015

(30) Foreign Application Priority Data

Dec. 21, 2012 (JP) .................................. 2012-279477

(51) Int. Cl.
*H01L 41/04* (2006.01)
*H04N 5/217* (2011.01)
(Continued)

(52) U.S. Cl.
CPC .......... *H01L 41/042* (2013.01); *B41J 2/14201* (2013.01); *B41J 2/14233* (2013.01);
(Continued)

(58) Field of Classification Search
None
See application file for complete search history.

(56) References Cited

U.S. PATENT DOCUMENTS

2014/0124695 A1* 5/2014 Koyama .................. B08B 7/02
252/62.9 PZ
2015/0041701 A1* 2/2015 Murakami ........... B41J 2/14233
252/62.9 PZ (Continued)

FOREIGN PATENT DOCUMENTS

| JP | H04-17580 A | 1/1992 |
|---|---|---|
| JP | 2008-150247 A | 7/2008 |
| WO | 2012-093646 A1 | 7/2012 |

OTHER PUBLICATIONS

Jiang et al., "Effects of MnO2 and sintering temperature on microstructure, ferroelectric, and piezoelectric properties of Ba0.85Ca0.15Ti0.90Zr0.10O3 lead-free ceramics", J Mater Sci (2013) vol. 48, No. 3, pp. 1035-1041.

(Continued)

*Primary Examiner* — Shahbaz Nazrul
(74) *Attorney, Agent, or Firm* — Canon U.S.A., Inc., IP Division

(57) ABSTRACT

A vibration wave driving device including a lead-free piezoelectric material that can be driven with high reliability over a wide operating temperature range, an image pickup device including the vibration wave driving device, and an optical apparatus including the vibration wave driving device are provided. The vibration wave driving device generates a vibration wave by applying an AC voltage to a piezoelectric element, and includes the piezoelectric element and a capacitor that satisfy $20[°C.] \leq T\in(Cmax)-T\in(Pmax) \leq 75[°C.]$ and $0.50 \leq \in(Cc)/\in(Cmax) \leq 0.80$.

9 Claims, 14 Drawing Sheets

(51) Int. Cl.
*H02N 2/00* (2006.01)
*H01L 41/18* (2006.01)
*H02N 2/10* (2006.01)
*H04N 5/225* (2006.01)
*H04N 5/335* (2011.01)
*G02B 7/10* (2006.01)
*G02B 27/00* (2006.01)
*H01L 41/187* (2006.01)
*H02N 2/16* (2006.01)
*H01L 41/09* (2006.01)
*H02N 2/14* (2006.01)
*B41J 2/14* (2006.01)

(52) U.S. Cl.
CPC ......... *G02B 7/102* (2013.01); *G02B 27/0006* (2013.01); *H01L 41/0973* (2013.01); *H01L 41/18* (2013.01); *H01L 41/1871* (2013.01); *H02N 2/001* (2013.01); *H02N 2/103* (2013.01); *H02N 2/106* (2013.01); *H02N 2/163* (2013.01); *H04N 5/2171* (2013.01); *H04N 5/2254* (2013.01); *H04N 5/335* (2013.01); *B41J 2202/03* (2013.01); *H02N 2/145* (2013.01)

(56) References Cited

U.S. PATENT DOCUMENTS

| | | | |
|---|---|---|---|
| 2015/0053884 A1* | 2/2015 | Matsuda | B41J 2/14233 252/62.9 PZ |
| 2015/0295161 A1* | 10/2015 | Uebayashi | B32B 18/00 347/68 |
| 2015/0368161 A1* | 12/2015 | Murakami | B41J 2/14233 252/62.9 PZ |
| 2015/0368162 A1* | 12/2015 | Hayashi | B41J 2/14233 252/62.9 PZ |

OTHER PUBLICATIONS

Sakabe et al., "High-Dielectric Constant Ceramics for Base Metal Monolithic Capacitors", Proceedings of the 3rd Meeting on Ferroelectric Materials and Their Applications (FMA-3), Kyoto, 1981, Japanese Journal of Applied physics, vol. 20 (1981) Supplement 20-4, pp. 147-150.

\* cited by examiner

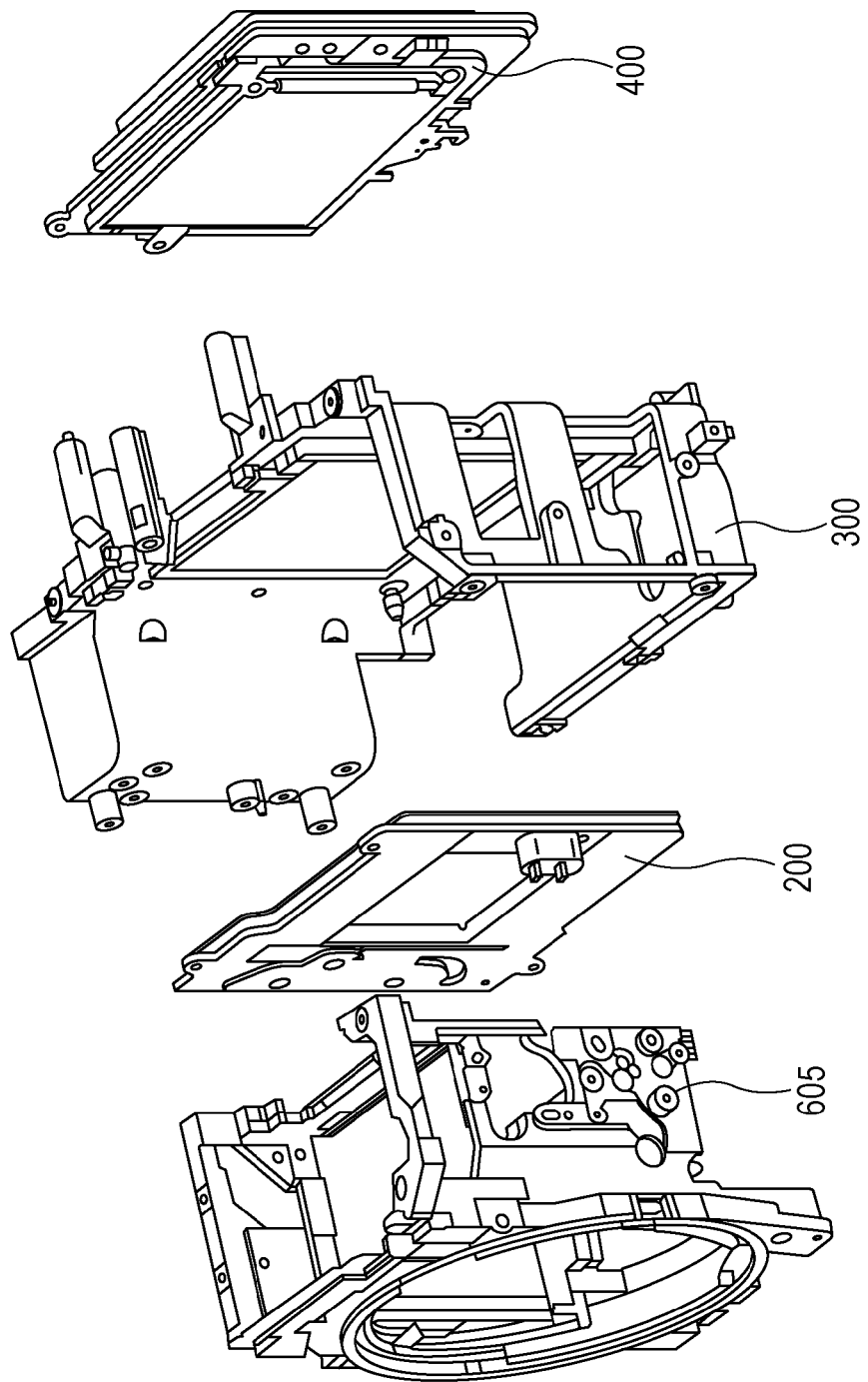

VIBRATION WAVE DRIVING DEVICE, IMAGE PICKUP DEVICE, OPTICAL APPARATUS, LIQUID DISCHARGE DEVICE, AND ELECTRONIC APPARATUS

TECHNICAL FIELD

The present invention relates to a vibration wave driving device, and to an image pickup device, an optical apparatus, a liquid discharge device, and an electronic apparatus including the vibration wave driving device.

BACKGROUND ART

Lead-free piezoelectric materials having a piezoelectric performance equivalent to that of lead zirconate titanate (PZT), which contains a large amount of lead that is harmful to human body, have been developed as a substitute for PZT. In recent years, a lead-free piezoelectric material containing barium titanate has been proposed, as described in PTL 1. However, barium titanate has a crystal structure that undergoes phase transition at a temperature close to room temperature (about 5° C.) Therefore, the piezoelectric performance of a piezoelectric element including barium titanate varies in accordance with variation in the ambient temperature. As a result, there is a problem that electric power consumed to cause a certain piezoelectric displacement differs by a large amount depending on the ambient temperature.

PTL 2 proposes a technology regarding a drive circuit of an ultrasonic motor. In the drive circuit described in PTL 2, a capacitor is arranged parallel to the ultrasonic motor, so that variation in clamped capacity of the ultrasonic motor is canceled in a temperature range higher than room temperature.

CITATION LIST

Patent Literature

PTL 1 Japanese Patent Laid-Open No. 2008-150247
PTL 2 Japanese Patent Laid-Open No. 04-17580

SUMMARY OF INVENTION

Technical Problem

However, as is clear from Table 1 of PTL 2, when the ambient temperature is 0° C. or less, the capacitance changes by a large amount from that at room temperature (20° C.). For example, the rate of change is −12.3% at −20° C. Thus, it has been difficult to realize a vibration wave driving device with stable power consumption over a wide temperature range.

The present invention provides a vibration wave driving device including a lead-free piezoelectric material that can be driven with stable power consumption over a wide operating temperature range. The present invention also provides an image pickup device, an optical apparatus, a liquid discharge device, and en electronic apparatus including the vibration wave driving device.

Solution to Problem

A vibration wave driving device according to an aspect of the present invention generates a vibration wave by applying an AC voltage to a piezoelectric element. The vibration wave driving device includes the piezoelectric element including a piezoelectric material and an electrode; and a capacitor that is connected in parallel to the piezoelectric element. The piezoelectric material contains a perovskite-type metal oxide as a main component, the perovskite-type metal oxide being represented by general formula (1):

$$(Ba_{1-x}Ca_x)_a(Ti_{1-y}Zr_y)O_3 \qquad (1)$$

Here, $1.00 \leq a \leq 1.01$, $0.02 \leq x \leq 0.30$, $0.020 \leq y \leq 0.095$, and $y \leq x$ are satisfied. The perovskite-type metal oxide contains Mn, the content of Mn in 100 parts by weight of the perovskite-type metal oxide being 0.02 parts by weight or more and 0.40 parts by weight or less on a metal basis. The capacitor contains Ba, Ca, Ti, and Zr as main components. When a maximum value of a relative dielectric constant of the piezoelectric material in a temperature range of −60° C. to +50° C. is ∈(Pmax), a temperature at the maximum value of the relative dielectric constant of the piezoelectric material is T∈(Pmax), a relative dielectric constant of the capacitor at the temperature T∈(Pmax) is ∈(Cc), a maximum value of the relative dielectric constant of the capacitor in the temperature range of −60° C. to +50° C. is ∈(Cmax), and a temperature at the maximum value of the relative dielectric constant of the capacitor is T∈(Cmax), $20[° C.] \leq T∈(Cmax) - T∈(Pmax) \leq 75[° C.]$ and $0.50 \leq ∈(Cc)/∈(Cmax) \leq 0.80$ are satisfied.

BRIEF DESCRIPTION OF DRAWINGS

FIG. 10 is an exploded perspective view of the main part of the digital single-lens reflex camera as the image pickup device according to the embodiment of the present invention.

DESCRIPTION OF EMBODIMENTS

The present invention will now be described in detail with reference to the drawings.

Figure 1:
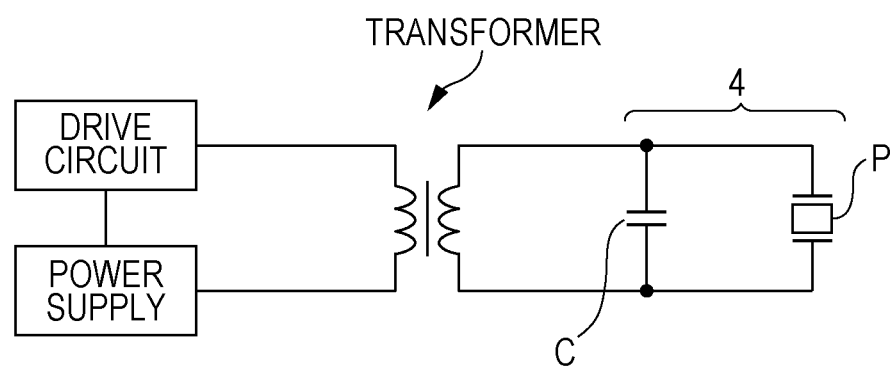
FIG. 1 is a circuit diagram illustrating the man part of a vibration wave driving device according to an embodiment of the present invention.

FIG. 1 is a circuit diagram of the main part of a vibration wave driving device according to an embodiment.

The vibration wave driving device according to the present embodiment includes a piezoelectric element P and a capacitor that is connected in parallel to the piezoelectric element P. The piezoelectric element P is vibrated by applying thereto an AC voltage generated by a drive circuit when the drive circuit receives electric power from a power supply.

The power supply is connected to the drive circuit, and the drive circuit has a function of generating a periodic AC voltage in the form of, for example, a square wave or a sine wave, when the drive circuit receives the electric power from the power supply. The AC voltage output from the drive circuit is increased by a transformer to a voltage suitable for causing the piezoelectric element P to vibrate, and is applied to the piezoelectric element included in a circuit on the secondary side of the transformer. The piezoelectric element P is connected in parallel to the capacitor C for temperature compensation, which will be described in detail below, and forms a resonant circuit together with an inductance element on the secondary side of the transformer. Thus, the piezoelectric element P can be efficiently vibrated. The transformer illustrated in FIG. 1 may be replaced by an inductance element. In this case, the inductance element forms a parallel resonant circuit together with the capacitor C, which is connected in parallel to the piezoelectric element P, and the AC voltage input from the drive circuit is applied to the piezoelectric element P after being increased.

The state in which the piezoelectric element P and the capacitor C are connected in parallel means that electrodes of the piezoelectric element P and electrodes of the capacitor C are electrically connected in parallel, and the method of connection is not particularly limited. For example, the electrodes may be connected by lead wires, substrate wiring, flexible wiring, or metal plates.

The drive circuit is capable of causing the piezoelectric element P to vibrate in a desired vibrating state by adjusting the duty ratio or the like of the output AC voltage and changing the frequency and phase of the AC voltage applied to the piezoelectric element P.

Figure 2:
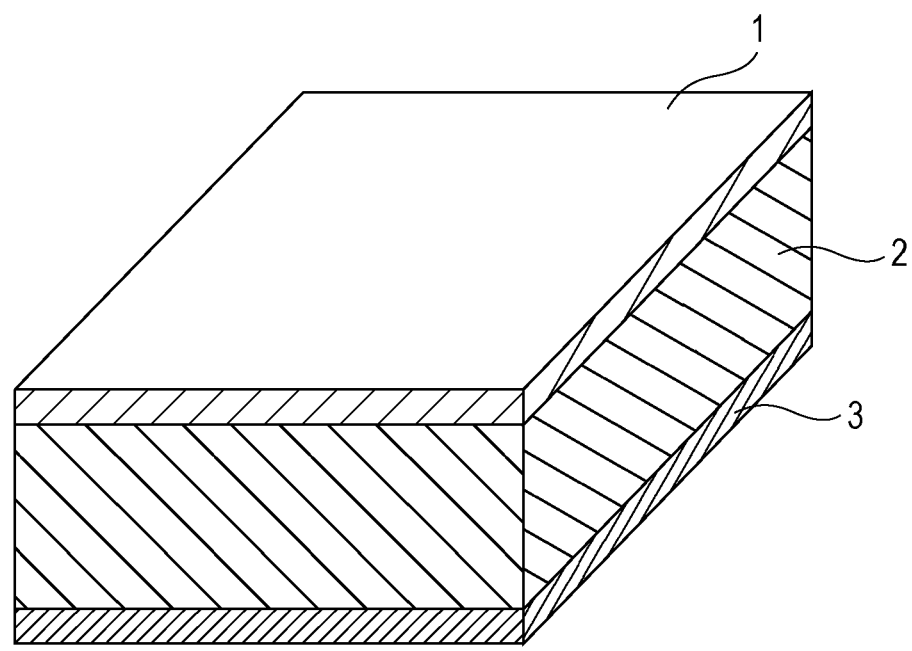
FIG. 2 is a schematic diagram illustrating the structure of a piezoelectric element included in the vibration wave driving device according to the embodiment of the present invention.

FIG. 2 is a schematic diagram illustrating the structure of the piezoelectric element P included in the vibration wave driving device according to the embodiment of the present invention. The piezoelectric element P according to the embodiment of the present invention includes at least a piezoelectric material 2, a first electrode 1, and a second electrode 3.

The piezoelectric material 2 included in the piezoelectric element P contains a perovskite-type metal oxide as a main component, the perovskite-type metal oxide being represented by general formula (1): $(Ba_{1-x}Ca_x)_a(Ti_{1-y}Zr_y)O_3$ ($1.00 \leq a \leq 1.01$, $0.02 \leq x \leq 0.30$, $0.020 \leq y \leq 0.095$, and $y \leq x$). The metal oxide contains Mn, and the content of Mn in 100 parts by weight of the metal oxide is 0.02 parts by weight or more and 0.40 parts by weight or less on a metal basis.

The perovskite-type metal oxide is a metal oxide having a perovskite structure, which is ideally a cubic crystal structure, as described in Iwanami Rikagaku Jiten, 5th edition (published by Iwanami Shoten, Publishers on Feb. 20, 1998). Metal oxides having the perovskite structure generally have a chemical formula of $ABO_3$. In the metal oxide represented by general formula (1), metal elements that occupy the A sites are Ba and Ca, and metal elements that occupy the B sites are Ti and Zr. However, some of Ba and Ca atoms may occupy the B sites. Similarly, some of Ti and Zr atoms may occupy the A sites.

In general formula (1), the molar ratio between the elements at the B sites and O is 1:3. However, even when the molar ratio is slightly different from 1:3 (for example, 1.00:2.94 to 1.00:3.06), the metal oxide is still included in the scope of the present embodiment as long as the metal oxide has the perovskite structure as a main phase. A metal oxide can be considered to have the perovskite structure as a main phase if, when X-ray diffraction is performed on the piezoelectric material 2, the peak at the strongest diffraction intensity is caused by the perovskite structure. Whether or not the piezoelectric material 2 has the perovskite structure may be determined by structural analysis based on, for example, X-ray diffraction or electron beam diffraction.

In general formula (1), the ratio a of the molar quantity of Ba and Ca at the A sites to the molar quantity of Ti and Zr at the B sites is in a range of $1.00 \leq a \leq 1.01$. When a is less than 1.00, abnormal grain growth easily occurs and the mechanical strength of the material decreases. When a is greater than 1.01, the temperature required for grain growth becomes excessively high, and sintering cannot be performed in a common firing furnace. In general formula (1), the molar ratio x of Ca at the A sites is in the range of $0.02 \leq x \leq 0.30$. When x is less than 0.02, the dielectric loss (tan δ) increases. When the dielectric loss increases, the amount of heat generated when a voltage is applied to the piezoelectric element P to drive the piezoelectric element P increases, and there is a risk that the drive efficiency will be reduced. When x is greater than 0.30, the piezoelectric property becomes insufficient.

In general formula (1), the molar ratio y of Zr at the B sites is in the range of $0.020 \leq y \leq 0.095$. When y is less than 0.020, the piezoelectric property becomes insufficient. When y is greater than 0.095, the Curie temperature ($T_c$) becomes less than 85° C. and the piezoelectric property cannot be obtained at a high temperature.

In general formula (1), the molar ratio x of Ca and the molar ratio y of Zr satisfy $y \leq x$. When $y > x$, the dielectric loss increases and the insulating property becomes insufficient. A piezoelectric material that satisfies all of the above-mentioned ranges of x and y has a crystal structure having a phase transition temperature lower than temperatures around room temperature, so that the element can be stably driven over a wide temperature range.

The method for determining the composition of the piezoelectric material 2 included in the piezoelectric element P according to the embodiment of the present invention is not particularly limited. The method may be, for example, X-ray fluorescence analysis (XRF), ICP emission spectrochemical analysis, or atomic absorption analysis. The weight ratio and compositional ratio of each of the elements contained in the piezoelectric material 2 can be determined by any of these methods.

In the piezoelectric material 2 included in the piezoelectric element P according to the embodiment of the present invention, the content of Mn in 100 parts by weight of the metal oxide is 0.02 parts by weight or more and 0.40 parts by weight or less on a metal basis. When the content of Mn in the piezoelectric material 2 is in this range, the insulation property and mechanical quality factor of the piezoelectric material 2 can be improved. Here, the content of Mn "on a metal basis" is a value determined by determining the oxide-based amounts of elements constituting the metal oxide represented by general formula (1) from the contents of the metals, that is, Ba, Ca, Ti, Zr, and Mn, measured by subjecting the piezoelectric material 2 to XRF, ICP emission spectrochemical analysis, atomic absorption analysis, or the like, and calculating the ratio of the weight of Mn when the total weight of the elements is assumed to be 100.

When the content of Mn is less than 0.02 parts by weight, the effect of poling treatment required to drive the element becomes insufficient. When the content of Mn is greater than 0.40 parts by weight, the piezoelectric property becomes insufficient and the power consumption increases. In addition, crystals having a hexagonal structure that does not contribute to the piezoelectric property are generated.

The Mn atoms can occupy the B sites. When the Mn atoms occupy the B sites as solid solution, the ratio of the molar quantity A of Ba and Ca at the A sites to the molar quantity B of Ti, Zr, and Mn at the B sites can be in the range of $0.992 \leq A/B \leq 0.999$. A piezoelectric material in which A/B is in this range has a high piezoelectric constant and a high mechanical quality factor. Therefore, a device including the piezoelectric material 2 is highly durable.

The valence of Mn can be 4+. In general, the valence of Mn may be 4+, 2+, or 3+. When conduction electrons are present in the crystals (for example, when there are oxygen defects in the crystals or donor elements are at the A sites), the valence of Mn can be reduced from 4+ to 3+ or to 2+ to trap the conduction electrons and increase the insulation resistance. Also from the viewpoint of ion radius, when the valence of Mn is 4+, Ti, which is the main component at the B sites, can be easily replaced.

When the valence of Mn is 2+, for example, and is smaller than 4+, Mn functions as an acceptor. When Mn that functions as an acceptor is present in the crystals having the perovskite structure, holes or oxygen vacancies are formed in the crystals.

When the valence of most of the Mn atoms contained in the piezoelectric material is 2+ or 3+, the holes cannot be compensated for simply by the introduction of oxygen vacancies, and the insulation resistance is reduced. Therefore, the valence of most of the Mn atoms may be 4+. However, a significantly small amount of Mn atoms may have a valence smaller than 4+ and occupy the B sites of the perovskite structure as an acceptor to form oxygen vacancies. This is because the Mn atoms having a valence of 2+ or 3+ form defect dipoles together with the oxygen vacancies to thereby increase the mechanical quality factor of the piezoelectric material 2. The piezoelectric material 2 of the piezoelectric element P according to the embodiment of the present invention may contain components other than the metal oxide represented by general formula (1) and Mn (hereinafter referred to as sub-components) as long as the property thereof does not change.

The shape of the piezoelectric material 2 of the piezoelectric element P according to the embodiment of the present invention is not particularly limited, and may be an annular shape or a plate shape.

Each of the electrodes 1 and 3 is formed of a conductive layer having a thickness of about 5 nm to 2000 nm. The material of the electrodes 1 and 3 is not particularly limited, and a material commonly used in piezoelectric elements may be used. Examples of the material include metals such as Ti, Pt, Ta, Ir, Sr, In, Sn, Au, Al, Fe, Cr, Ni, Pd, Ag, and Cu and compounds thereof.

Each of the electrodes 1 and 3 may be made of one of these materials or be formed as a stack of layers made of two or more of these materials. Each of the electrodes 1 and 3 may be provided in a plurality. Also, the electrodes 1 and 3 may have different shapes and be made of different materials.

The method for manufacturing the electrodes 1 and 3 is not particularly limited. For example, the electrodes 1 and 3 may be formed by metal paste printing, sputtering, or vapor deposition.

The piezoelectric element P can have polarization axes oriented in substantially the same direction. When the polarization axes are oriented in substantially the same direction, the piezoelectric element P has a high piezoelectric constant.

The method for poling the piezoelectric element P is not particularly limited. The poling treatment can be performed in the air or silicone oil. The temperature at which the poling treatment is performed can be 60° C. to 150° C. However, the optimum conditions somewhat vary depending on the composition of the piezoelectric material 2 included in the element. The electric field applied in the poling treatment can be 800 V/mm to 2.0 kV/mm.

The piezoelectric constant and mechanical quality factor of the piezoelectric element P can be calculated from resonant and antiresonant frequencies measured by using a commercially available impedance analyzer on the basis of Standard of Japan Electronics and Information Technology Industries Association (JEITA EM-4501).

In an operating temperature range of −25° C. to +50° C., the relative dielectric constant of the piezoelectric material 2 included in the piezoelectric element P increases as the temperature decreases. Accordingly, a temperature compensation capacitor C having a temperature characteristic described below is connected in parallel to the piezoelectric element P, so that a vibration wave driving device 4 that can be driven with stable power consumption over a wide temperature range can be provided.

Figure 3:
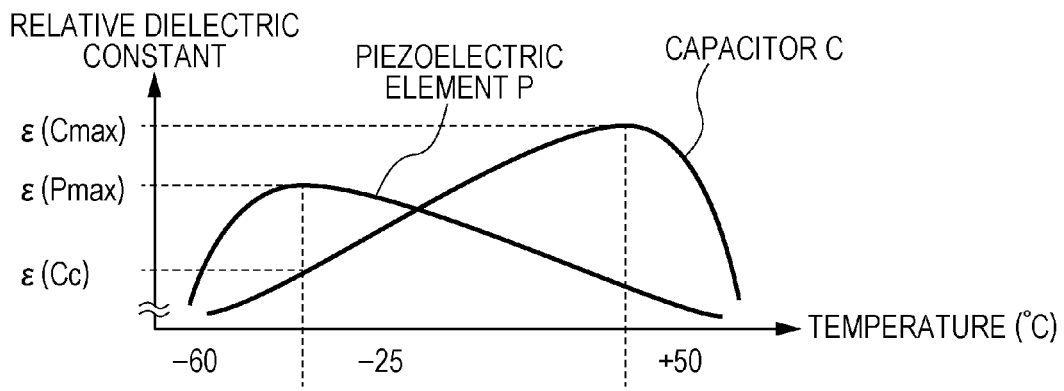
FIG. 3 is a graph showing variations in relative dielectric constants of a piezoelectric material of the piezoelectric element and a capacitor included in the vibration wave driving device according to the embodiment with respect to temperature.

FIG. 3 is a graph showing variations in relative dielectric constants of the piezoelectric element P and the capacitor C included in the vibration wave driving device 4 according to the present embodiment with respect to temperature. The graph of FIG. 3 qualitatively shows the variations in the relative dielectric constants of the capacitor C and the piezoelectric element P with respect to temperature, and the piezoelectric element P and the capacitor C according to the embodiment of the present invention are not limited to the characteristics shown in the graph.

Here, $\in$(Pmax) represents the maximum value of the relative dielectric constant of the piezoelectric element P in the range of −60° C. to +50° C., and T$\in$(Pmax) represents the temperature at the maximum value.

The relative dielectric constant of the piezoelectric material 2 increases as the temperature decreases from +50° C. In other words, the relative dielectric constant of the piezoelectric element P decreases from $\in$(Pmax) as the temperature of the piezoelectric element P increases from T$\in$(Pmax).

The capacitor C, which is connected in parallel to the piezoelectric element P, includes at least a pair of electrodes and a dielectric material interposed between the electrodes. The dielectric material contains Ba, Ca, Ti, and Zr as main components. The relative dielectric constant of the capacitor C has a characteristic shown in FIG. 3.

The capacitor C contains Ba, Ca, Ti, and Zr as main components, and the phase transition temperature thereof can be changed by changing the composition ratio of the elements. Thus, the temperature characteristic of the relative dielectric constant can be controlled.

The capacitor C contains Ba, Ca, Ti, and Zr as main components, similar to the piezoelectric material 2. Therefore, the rate of change in the relative dielectric constant with respect to temperature can be made close to that of the piezoelectric material 2.

Here, $\in$(Cc) represents the relative dielectric constant of the capacitor C at the temperature T$\in$(Pmax), $\in$(Cmax) represents the maximum value of the relative dielectric constant of the capacitor C in the range of −60° C. to +50° C., and T$\in$(Cmax) represents the temperature at the maximum value. The relative dielectric constant of the capacitor C decreases as the temperature decreases from +50° C.

When 20[° C.]≤T$\in$(Cmax)−T$\in$(Pmax)≤75[° C.] and 0.50≤$\in$(Cc)/$\in$(Cmax)≤0.80 are satisfied, a vibration wave driving device 4 including a lead-free piezoelectric material that can be driven with stable power consumption over an operating temperature range of −25° C. to 50° C. can be provided.

The method for determining the relative dielectric constant of the piezoelectric element P according to the embodiment of the present invention is not particularly limited. For example, an arbitrary portion interposed between the electrodes 1 and 3 can be cut out, and the capacitance can be calculated from the impedance measured by an LCR meter or an impedance analyzer and the phase difference. Then, the relative dielectric constant can be calculated from the area of the electrodes, the thickness of the piezoelectric material 2, and the electric constant cO. The relative dielectric constant of the piezoelectric material 2 differs from that before the poling treatment. Therefore, the relative dielectric constant mentioned herein refers to the value after the poling treatment, so that the power consumption during the driving operation can be further stabilized.

The relative dielectric constant of the capacitor C according to the embodiment of the present invention can be measured by a method similar to the method for determining the relative dielectric constant of the piezoelectric element P. The capacitor C provides the above-described effect even when the capacitor C is subjected to poling treatment. However, it is desirable that the capacitor C not be subjected to poling treatment so that excess power consumption due to vibration of the capacitor C can be prevented. Whether or not the capacitor C has been subjected to poling treatment can be determined by determining the piezoelectric constant by the above-described method. Piezoelectric constants $d_{31}$, $d_{33}$, and $d_{15}$ can be 10 pm/V or less, and the poling treatment is not performed when the piezoelectric constants are in this range.

The values of T$\in$(Cmax), T$\in$(Pmax), $\in$(Cc), and $\in$(Cmax) are obtained by placing the piezoelectric element or the capacitor into a commercially available environmental test chamber and measuring the relative dielectric constant at each temperature by the above-described method while increasing the ambient temperature from −60° C. to +50° C. Here, a thermocouple can be directly bonded to the measurement sample and the relationship between the temperature of the environmental test chamber and the temperature of the measurement sample may be determined before the measurement. In such a case, the temperature of the measurement sample can be determined from the temperature of the environmental test chamber, and the accuracy of determination of T$\in$(Cmax), T$\in$(Pmax), $\in$(Cc), and $\in$(Cmax) can be increased.

The form of the piezoelectric material 2 and the dielectric material is not particularly limited, and may be a ceramic, a single crystal, or a film. For example, the piezoelectric material 2 and the dielectric material may be in the form of a ceramic. In this specification, the term "ceramic" refers to a polycrystal, which is an aggregate (also called a bulk body) of crystal grains that are basically composed of a metal oxide and sintered together by heat treatment. The term "ceramic" also refers to a ceramic that has been processed after the sintering process.

The method for producing the piezoelectric material 2 and the dielectric material is not particularly limited.

The piezoelectric material 2 and the dielectric material can be produced by a general process in which solid powders of oxides, carbonates, nitrates, oxalates, etc., containing the constituent elements are sintered at a normal pressure. The raw materials used are metal compounds such as a Ba compound, a Ca compound, a Ti compound, a Zr compound, and a Mn compound.

The method for granulating the raw materials of the piezoelectric material 2 and the capacitor C is not particularly limited. From the viewpoint of making the diameter of the granulated powder uniform, a spray dry method may be used.

Polyvinyl alcohol (PVA), polyvinyl butyral (PVB), and acrylic resins may be used as a binder in the granulating process. The amount of binder that is added can be in the range of 1 to 10 parts by weight, and is preferably in the range of 2 to 5 parts by weight from the viewpoint of increasing the density of the compact.

The method for sintering the piezoelectric material 2 is not particularly limited.

For example, sintering may be performed in an electric furnace or a gas furnace or by an electric heating method, a microwave sintering method, a millimeter wave sintering method, or a hot isostatic pressing (HIP) method. In the case where an electric furnace or a gas furnace is used, the furnace may either be a continuous furnace or a batch furnace.

The temperature at which the piezoelectric material 2 is sintered in the above-described sintering method is not particularly limited. The temperature may be such that the compounds react to cause sufficient crystal growth. From the viewpoint of making the grain diameter of the piezoelectric material 2 to be in the range of 1 μm to 10 μm, the sintering temperature can be 1200° C. or more and 1550° C. or less, and is preferably 1300° C. or more and 1480° C. or less. When the piezoelectric material 2 is sintered in this temperature range, the piezoelectric material 2 provides a satisfactory piezoelectric performance.

To stabilize the properties of the piezoelectric material obtained by the sintering process with high reproducibility, the sintering process may be performed for 2 to 24 hours while the sintering temperature is maintained constant in the above-described range. Although a two-step sintering method, for example, may be used, rapid temperature changes may be avoided from the viewpoint of productivity.

The material of the electrodes of the capacitor C is not particularly limited, and a material commonly used in capacitors may be used. Examples of the material include metals such as Ti, Pt, Ta, Ir, Sr, In, Sn, Au, Al, Fe, Cr, Ni, Pd, Ag, and Cu and compounds thereof.

The method for manufacturing the electrodes included in the capacitor is also not particularly limited. For example, the electrodes may be formed by metal paste printing, sputtering, or vapor deposition.

Examples 1 to 9

The relationship between the temperatures T∈(Cmax) and T∈(Pmax) and the relative dielectric constants ∈(Cc) and ∈(Cmax) will now be described in detail by way of examples.

A plurality of piezoelectric elements P including piezoelectric materials 2 having different compositions were prepared, and capacitors C having Ba, Ca, Ti, and Zr as main components and having different temperature characteristics were prepared as capacitors C to be connected in parallel to the piezoelectric elements P. The power consumption of the piezoelectric vibrator included in the vibration wave driving device 4 was measured with a commercially available wattmeter. To reliably confirm the effect in the above-described operating temperature range, the temperature range for the measurement was extended at the low-temperature side, and the power consumption was measured at temperatures of −30° C., +25° C., and +50° C. Table 1 shows the composition of each piezoelectric material 2 and the characteristics of each capacitor C. Table 2 shows the power consumption at each temperature. In the present embodiment, each piezoelectric material 2 and each capacitor C have substantially the same volume. The rate of change in relative dielectric constant caused by a change in the ambient temperature does not vary in accordance with the volume. Therefore, the thickness and area may be selected as appropriate in accordance with the use. In the examples, the vibration wave driving device 4 includes a single capacitor C and a single piezoelectric element P that are connected in parallel, as illustrated in FIG. 1. However, an effect similar to that of embodiments of the present invention can also be achieved by a vibration wave driving device 4 including a plurality of capacitors C and a plurality of piezoelectric elements P.

TABLE 1

| | Composition of Piezoelectric Material | | | | Mn parts by weight | T∈ (Cmax) [° C.] | T∈ (Pmax) [° C.] | T∈ (Cmax) − T∈ (Pmax) [° C.] | Characteristics of Capacitor C | | |
|---|---|---|---|---|---|---|---|---|---|---|---|
| | Ba 1 − x | Ca x | Ti 1 − y | Zr y | | | | | ∈ (Cmax) | ∈ (Cc) | ∈ (Cc)/ ∈ (Cmax) |
| Example 1 | 0.927 | 0.073 | 0.980 | 0.020 | 0.24 | 0 | −20 | 20 | 2100 | 1050 | 0.50 |
| Example 2 | 0.851 | 0.149 | 0.960 | 0.040 | 0.24 | 10 | −40 | 50 | 2100 | 1050 | 0.50 |
| Example 3 | 0.824 | 0.176 | 0.980 | 0.020 | 0.24 | 15 | −60 | 75 | 2100 | 1050 | 0.50 |
| Example 4 | 0.832 | 0.168 | 0.905 | 0.095 | 0.24 | 0 | −20 | 20 | 1500 | 1200 | 0.80 |
| Example 5 | 0.825 | 0.175 | 0.940 | 0.060 | 0.24 | 10 | −40 | 50 | 1500 | 1200 | 0.80 |
| Example 6 | 0.728 | 0.272 | 0.905 | 0.095 | 0.24 | 15 | −60 | 75 | 1500 | 1200 | 0.80 |
| Example 7 | 0.840 | 0.160 | 0.940 | 0.060 | 0.40 | 15 | −37 | 52 | 1400 | 980 | 0.70 |
| Example 8 | 0.840 | 0.160 | 0.940 | 0.060 | 0.26 | 15 | −35 | 50 | 1400 | 980 | 0.70 |
| Example 9 | 0.813 | 0.187 | 0.940 | 0.060 | 0.26 | 15 | −45 | 60 | 1400 | 980 | 0.70 |
| Comparative Example 1 | 0.940 | 0.060 | 1.000 | 0.000 | 0.24 | −10 | −20 | 10 | 2100 | 1050 | 0.50 |
| Comparative Example 2 | 1.000 | 0.000 | 0.930 | 0.070 | 0.24 | 25 | −60 | 85 | 1500 | 1200 | 0.80 |
| Comparative Example 3 | 0.927 | 0.073 | 0.980 | 0.020 | 0.24 | 0 | −20 | 20 | 2500 | 500 | 0.20 |
| Comparative Example 4 | 0.824 | 0.176 | 0.980 | 0.020 | 0.24 | 15 | −60 | 75 | 1500 | 1350 | 0.90 |

TABLE 2

| | Power Consumption (−30° C.) [W] | Power Consumption (+25° C.) [W] | Power Consumption (+50° C.) [W] |
|---|---|---|---|
| Example 1 | 0.97 | 0.99 | 0.97 |
| Example 2 | 0.95 | 0.97 | 0.95 |
| Example 3 | 0.97 | 0.98 | 0.96 |
| Example 4 | 0.97 | 0.99 | 0.97 |
| Example 5 | 0.95 | 0.97 | 0.95 |
| Example 6 | 0.97 | 0.99 | 0.96 |
| Example 7 | 0.97 | 0.99 | 0.99 |
| Example 8 | 0.96 | 0.96 | 0.96 |
| Example 9 | 0.96 | 0.96 | 0.96 |
| Comparative Example 1 | 1.30 | 0.99 | 0.90 |
| Comparative Example 2 | 0.90 | 0.99 | 0.99 |
| Comparative Example 3 | 1.20 | 0.99 | 0.99 |
| Comparative Example 4 | 0.70 | 0.99 | 0.80 |

The power consumption of the vibration wave driving device 4 according to Example 1 was 0.97 [W] at the temperature of −30° C. The power consumption of the vibration wave driving device 4 according to Comparative Example 3, which includes a piezoelectric element P including a piezoelectric material 2 having the same composition as that in Example 1, was 23% greater than that in Example 1 at the temperature of −30° C. In Example 1, the variation between the power consumptions at the temperatures of −30° C., +25° C., and +50° C. was 1% or less. With regard to Comparative Examples 1 to 4, even in Comparative Example 2, in which the variation between the power consumptions at the respective temperatures was the smallest, the variation was as large as 10%. Thus, it was found that the power consumption is greatly affected by the variation in ambient temperature.

In Comparative Example 1, the difference between the temperatures T∈(Cmax) and T∈(Pmax) is as small as 10° C., and the effect of compensation for the relative dielectric constant in accordance with the temperature variation is small. The power consumption at the temperature of −30° C. is as large as 1.3 [W], and the power consumption is not sufficiently stable with respect to the temperature variation.

In Comparative Example 2, the difference between the temperatures T∈(Cmax) and T∈(Pmax) is as large as 85° C., and therefore the power consumption at the temperature of −30° C. is small. Also in this case, the power consumption is not sufficiently stable with respect to the temperature variation.

It has been found from Example 1, Comparative Example 1, Example 6, and Comparative Example 2 that the temperatures T∈(Cmax) and T∈(Pmax) are required to satisfy 20[° C.]≤T∈(Cmax)−T∈(Pmax)≤75[° C.].

As is clear from Comparative Examples 3 and 4, it is not sufficient to set T∈(Cmax) of the capacitor C and T∈(Pmax) of the piezoelectric material so as to satisfy the above-described relationship.

Specifically, when a change in the relative dielectric constant of the capacitor C caused by a temperature change is too small as in Comparative Example 3 or too large as in Comparative Example 4, the power consumption is not sufficiently stable, as is clear from Table 2. Therefore, 0.50≤∈(Cc)/∈(Cmax)≤0.80 needs to be satisfied.

Accordingly, it has been found that, when 20[° C.]≤T∈(Cmax)−T∈(Pmax)≤75[° C.] and 0.50≤∈(Cc)/∈(Cmax) ≤0.80 are satisfied, a vibration wave driving device 4 including a lead-free piezoelectric material that can be driven with high reliability over an operating temperature range of −25° C. to 50° C. can be provided.

Figure 4:
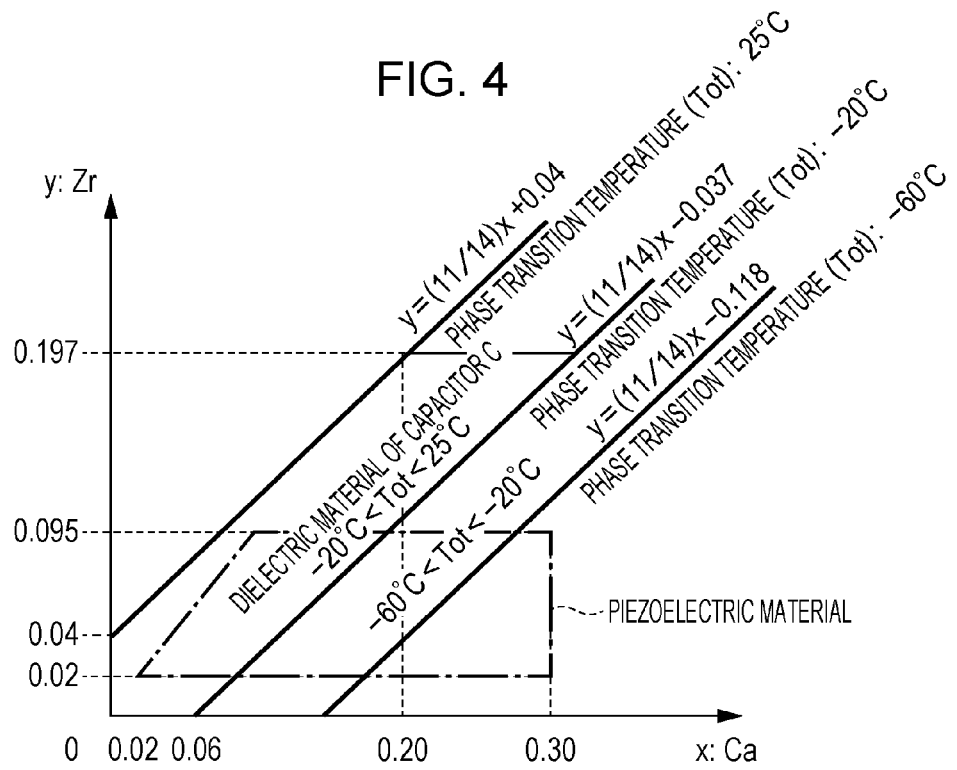
FIG. 4 is a composition diagram showing the compositions of the piezoelectric material and the capacitor, in which barium titanate is at the origin.

FIG. 4 is a composition diagram showing the compositions of the piezoelectric material 2 and the dielectric material that forms the capacitor C, in which barium titanate is at the origin. The horizontal and vertical axes respectively represent the molar ratio x of Ca at the A sites and the molar ratio y of Zr at the B sites of the piezoelectric material in units of mol %/100. The area surrounded by the one-dot chain line shows the composition of the piezoelectric material 2 included in the vibration wave driving device 4.

FIG. 4 shows the boundaries of composition at which the phase transition temperature (represented by Tot), at which the crystal structure changes from rhombic to tetragonal, is −60° C., −20° C., and +25° C.

In the general formula (1) above which represents the composition of the piezoelectric material 2, when the piezoelectric material 2 satisfies (11x/14)−0.118≤y≤(11x/14)−0.037, the phase transition temperature Tot is −20° C. or less, and the variation in relative dielectric constant in the operating temperature range of is small. In addition, Tot is −60° C. or more, so that the relative dielectric constant and the piezoelectric constant can be kept high over the operating temperature range.

In the case where the dielectric material that forms the capacitor C contains metal elements such as Ba, Ca, Ti, and Zr that are also contained in the piezoelectric material 2 of the piezoelectric element P, the main component of the dielectric material may be a metal oxide represented by general formula (2): $(Ba_{1-x'}Ca_{x'})_{a'}(Ti_{1-y'}Zr_{y'})O_3$ (0.9≤a'≤1.1, 0≤x', 0≤y'≤0.197, and (11x'/14)−0.037≤y'≤(11x'/14)+0.04).

When a dielectric material having such a composition is used, variation in the relative dielectric constant of the capacitor C with respect to temperature has a correlation profile reversed from that of variation in the relative dielectric constant of the piezoelectric element P with respect to temperature. Accordingly, the effect that the variations cancel each other is enhanced, and variation in the power consumption of the vibration wave driving device 4 with respect to temperature can be suppressed.

In general formula (2), the ratio a' of the molar quantity of Ba and Ca at the A sites to the molar quantity of Ti and Zr at the B sites is in a range of 0.9≤a'≤1.1. When a' is less than 0.9, abnormal grain growth easily occurs and the mechanical strength of the material decreases. When a' is greater than 1.1, the temperature required for grain growth becomes excessively high, and sintering cannot be performed in a common firing furnace.

In general formula (2), the molar ratio y' of Zr at the B sites is in the range of 0≤y'≤0.197. When y' is greater than 0.197, the firing temperature required in the firing process becomes 1500° C. or more, and the manufacturing cost is increased.

Examples in which the vibration wave driving device according to the embodiment of the present invention is applied to an ultrasonic motor, a vibration device, a dust removing device, and a liquid discharge head will now be described. Examples in which these devices are employed in an optical apparatus, an image pickup device, a liquid discharge device, and an electronic apparatus will also be described.

Ultrasonic Motor

First, a case in which the vibration wave driving device according to the embodiment of the present invention is applied to an ultrasonic motor will be described. An ultrasonic motor according to an embodiment of the present invention includes at least a vibrating member having the piezoelectric element P mounted thereon and a rotor that contacts the vibrating member.

Figure 5A:
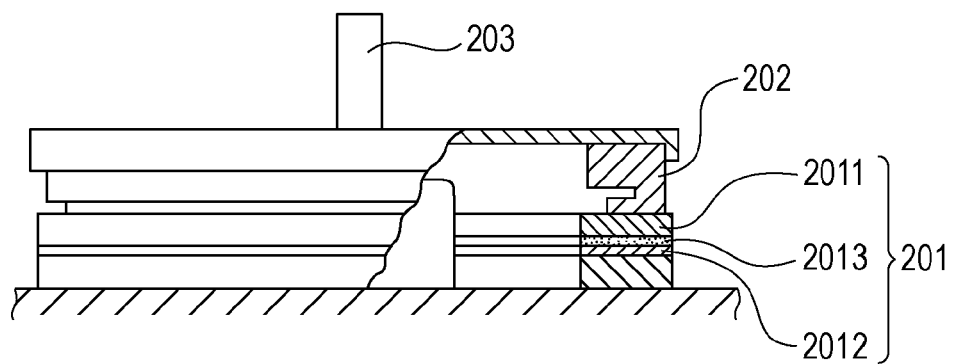
FIGS. 5A and 5B are schematic diagrams illustrating the structures of ultrasonic motors as vibration wave driving devices according to embodiments of the present invention.
Figure 5B:
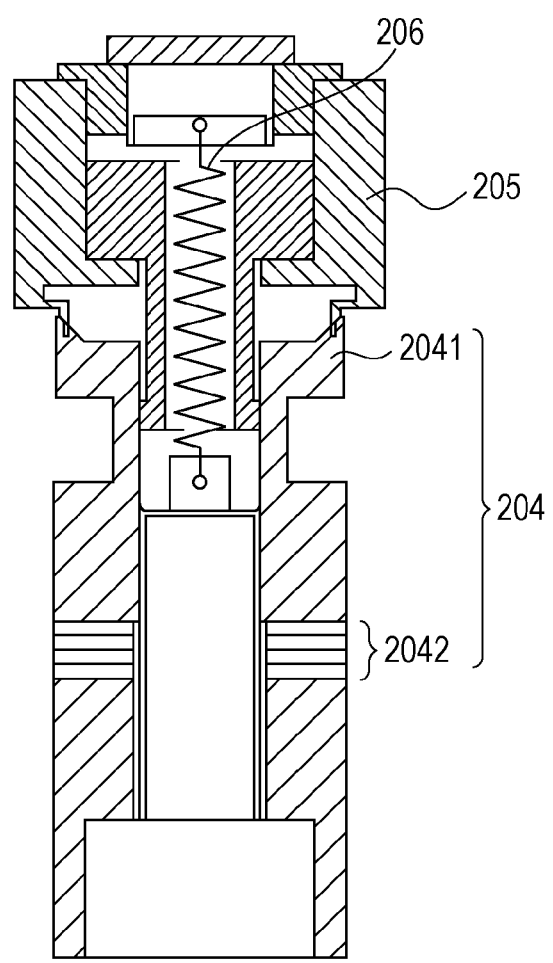

FIGS. 5A and 5B are schematic diagrams illustrating the structures of ultrasonic motors according to embodiments of the present invention. FIG. 5A illustrates an ultrasonic motor including a piezoelectric element having a single-plate structure. The ultrasonic motor includes a vibrator 201, a rotor 202 pressed against a sliding surface of the vibrator 201 by a pressing force applied by a pressing spring (not shown), and an output shaft 203 that is integrated with the rotor 202. The vibrator 201 includes a metal elastic ring 2011, a piezoelectric element 2012, and an organic adhesive 2013 (for example, an epoxy-based or cyanoacrylate-based adhesive) that bonds the piezoelectric element 2012 to the elastic ring 2011. The piezoelectric element 2012 includes a piezoelectric material interposed between first and second electrodes (not shown).

When two AC voltages having phases that differ from each other by the product of π/4 and an odd number are applied to the piezoelectric element 2012, a bending traveling wave is generated in the vibrator 201 and each point on the sliding surface of the vibrator 201 performs an elliptic motion. When the rotor 202 is in pressure-contact with the sliding surface of the vibrator 201, the rotor 202 receives frictional force from the vibrator 201 and rotates in a direction opposite to that of the bending travelling wave. An object to be driven (not shown) is bonded to the output shaft 203, and is driven by the rotational force of the rotor 202. When a voltage is applied to a piezoelectric material, the piezoelectric material expands and contracts due to the piezoelectric transversal effect. When an elastic member, such as a metal member, is bonded to the piezoelectric element, the elastic member is bent by the expansion and contraction of the piezoelectric material. The above-described ultrasonic motor is of a type that utilizes this principle.

FIG. 5B illustrates an ultrasonic motor including a piezoelectric element having a multilayered structure. A vibrator 204 includes a multilayered piezoelectric element 2042 interposed between cylindrical metal elastic members 2041. The multilayered piezoelectric element 2042 includes a plurality of piezoelectric material layers (not shown) that are stacked together, first and second electrodes provided on the outer surfaces of the stack, and an inner electrode disposed in the stack. The metal elastic members 2041 are fastened together with bolts to secure the piezoelectric element 2042 therebetween, and thus the vibrator 204 is formed.

When AC voltages having different phases are applied to the multilayered piezoelectric element 2042, the vibrator 204 excites two vibrations that are orthogonal to each other. The two vibrations are combined together, thereby generating a circular vibration for driving an end portion of the vibrator 204. An annular groove is formed in an upper portion of the vibrator 204, so that displacements caused by the vibration for the driving operation is increased. A rotor 205 is pressed against the vibrator 204 by a pressing spring 206, and receives frictional force for the driving operation. The rotor 205 is rotatably supported by a bearing.

Vibration Device and Dust Removing Device

Vibration devices used, for example, to convey or remove particles, powder, liquid droplets, etc., are commonly used in electronic apparatuses.

A dust removing device will now be described as an example of a vibration wave driving device according to an embodiment of the present invention. A vibration wave driving device according to an embodiment of the present invention includes a vibrating member including the above-described piezoelectric element or the above-described multilayered piezoelectric element. A dust removing device according to an embodiment of the present invention includes the vibration wave driving device in a vibrating unit thereof.

Figure 6A:
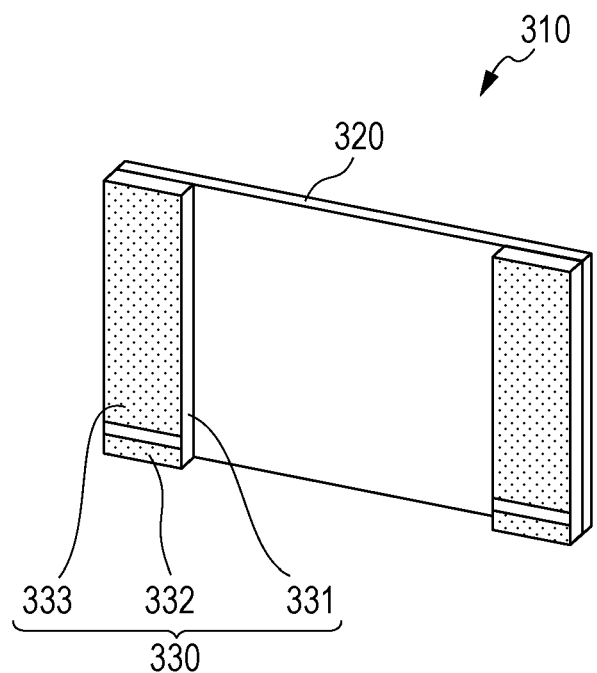
FIGS. 6A and 6B are schematic diagrams illustrating a dust removing device according to an embodiment of the present invention.
Figure 6B:
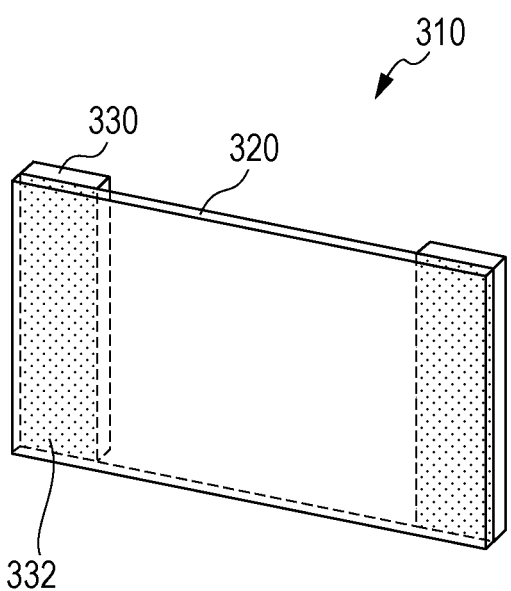

FIGS. 6A and 6B are schematic diagrams illustrating a dust removing device 310 according to an embodiment of the present invention. The dust removing device 310 includes plate-shaped piezoelectric elements 330 and a vibrating plate 320. Each of the piezoelectric elements 330 may be a multilayered piezoelectric element according to an embodiment of the present invention. Although the material of the vibrating plate 320 is not particularly limited, the vibrating plate 320 may be made of a transparent material or a reflective material when the dust removing device 310 is to be included in an optical device.

Figure 7A:
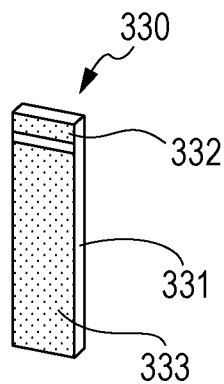
FIGS. 7A, to 7C are schematic diagrams illustrating the structure of a piezoelectric element.
Figure 7B:
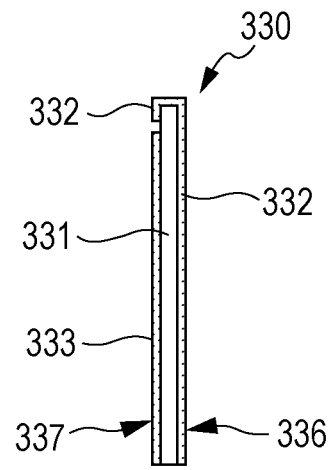
Figure 7C:
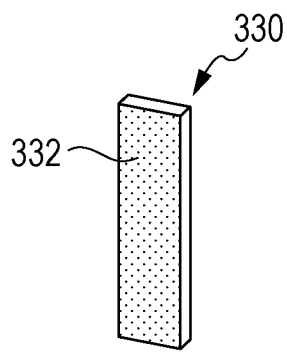

FIGS. 7A to 7C are schematic diagrams illustrating the structure of each piezoelectric element 330 in FIGS. 6A and 6B. FIGS. 7A and 7C are front and back views of the piezoelectric element 330, and FIG. 7B is a side view of the piezoelectric element 330. As illustrated in FIGS. 6A and 6B, each piezoelectric element 330 includes a piezoelectric material 331, a first electrode 332, and a second electrode 333, and the first electrode 332 and the second electrode 333 are arranged so as to oppose plate surfaces of the piezoelectric material 331. Similar to the structure illustrated in FIG. 5B, the piezoelectric element 330 may be a multilayered piezoelectric element according to an embodiment of the present invention. In such a case, the piezoelectric material 331 include piezoelectric material layers and inner electrodes that are alternately stacked, and the inner electrodes are short-circuited to the first electrode 332 and the second electrode 333 alternately, so that driving waves having different phases can be applied to each of the piezoelectric material layers. A surface of the piezoelectric element 330 on which the first electrode 332 is disposed at the front side in FIG. 7C is defined as a first electrode surface 336, and a surface of the piezoelectric element 330 on which the second electrode 333 is disposed at the front side in FIG. 7A is defined as a second electrode surface 337.

In the embodiment of the present invention, "electrode surfaces" refer to surfaces of a piezoelectric element on which electrodes are arranged, and the first electrode 332 may extend to the second electrode surface 337, as illustrated in FIGS. 7A and 7B.

Referring to FIGS. 6A and 6B, the piezoelectric elements 330 and the vibrating plate 320 are joined together by bonding the first electrode surface 336 of each piezoelectric element 330 to a plate surface of the vibrating plate 320. When the piezoelectric elements 330 are driven, stress is generated between each piezoelectric element 330 and the vibrating plate 320 and an out-of-plane vibration is generated in the vibrating plate 320. The dust removing device 310 according to the embodiment of the present invention causes the out-of-plane vibration of the vibrating plate 320 to remove foreign matter, such as dust, that has adhered to the surfaces of the vibrating plate 320. The out-of-plane vibration is an elastic vibration that causes the vibrating plate to move in an optical axis direction, that is, in the thickness direction of the vibrating plate.

Figure 8A:
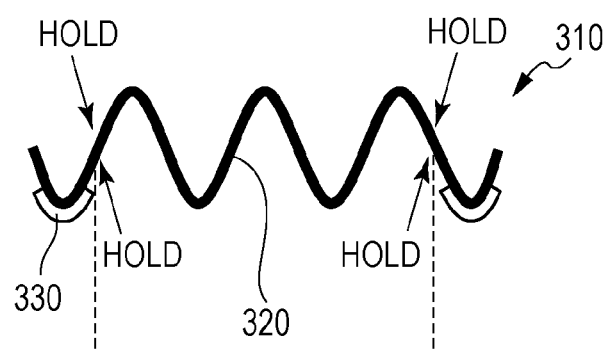
FIGS. 8A and 8B are schematic diagrams illustrating the principle of vibration of the dust removing device according to the embodiment of the present invention.
Figure 8B:
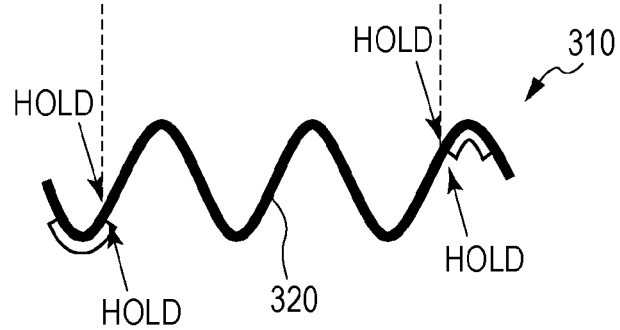

FIGS. 8A and 8B are schematic diagrams illustrating the principle of vibration of the dust removing device 310 according to the embodiment of the present invention. FIG. 8A illustrates the state in which an out-of-plane vibration is generated in the vibrating plate 320 by applying alternating currents having the same phase to the pair of left and right piezoelectric elements 330. The polarization directions of the piezoelectric materials included in the pair of left and right piezoelectric elements 330 are the same as the thickness direction of the piezoelectric elements 330, and the dust removing device 310 is driven in the seventh-order vibration mode. FIG. 8B illustrates the state in which an out-of-plane vibration is generated in the vibrating plate 320 by applying alternating currents having the phases shifted from each other by 180° to the pair of left and right piezoelectric elements 330. The dust removing device 310 is driven in the sixth-order vibration mode. The dust removing device 310 according to the embodiment of the present invention is capable of effectively removing the dust that has adhered to the surfaces of the vibrating plate by selectively setting at least two vibration modes.

Image Pickup Device

An image pickup device according to an embodiment of the present invention will now be described. An image pickup device according to an embodiment of the present invention at least includes a vibration wave driving device and an image pickup element unit, and a vibrating member included in the vibration wave driving device is provided on an light-receiving-surface side of the image pickup element unit.

Figure 9:
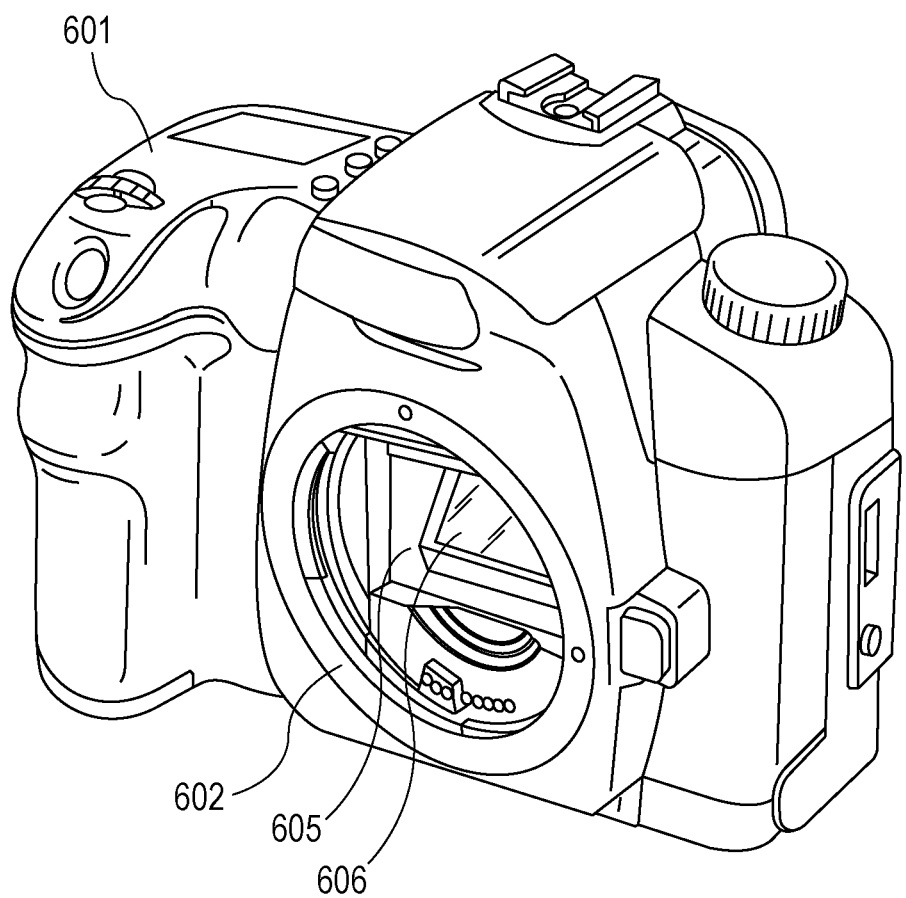
FIG. 9 illustrates a digital single-lens reflex camera as an image pickup device according to an embodiment of the present invention.

FIGS. 9 and 10 illustrate a digital single-lens reflex camera as an example of an image pickup device according to an embodiment of the present invention.

FIG. 9 is a front perspective view of a camera body 601 viewed from the object side, in a state in which an imaging lens unit is removed from the camera body 601. FIG. 10 is an exploded schematic perspective view illustrating the inner structure of the camera in a region around a dust removing device according to an embodiment of the present invention and an image pickup unit 400.

A mirror box 605, to which an imaging light beam that has passed through an imaging lens is guided, is disposed in the camera body 601, and a main mirror (quick return mirror)

606 is disposed in the mirror box 605. The main mirror 606 may be set to a state in which the main mirror 606 is at an angle of 45° relative to an imaging optical axis to guide the imaging light beam toward a penta-dach mirror (not shown) and a state in which the main mirror 606 is retracted from the imaging light beam so that the imaging light beam is guided to an image pickup element (not shown).

The mirror box 605 and a shutter unit 200 are arranged on the object side of a main body chassis 300, which constitutes a framework of the camera body, in that order from the object side. The image pickup unit 400 is arranged on the operator side of the main body chassis 300. The image pickup unit 400 is arranged so that an image pickup surface of the image pickup element is spaced from an attachment surface of a mount 602, which serves as a reference when an imaging lens unit is attached, by a predetermined distance and is parallel to the attachment surface.

The image pickup unit 400 includes a vibrating member of a dust removing device and an image pickup element unit. The vibrating member of the dust removing device is arranged coaxially with a light receiving surface of the image pickup element unit.

Although a digital single-lens reflex camera has been described as an image pickup device according to an embodiment of the present invention, the image pickup device may instead be, for example, a camera with an interchangeable imaging lens unit such as a mirrorless digital single-lens reflex camera which does not include the mirror box 605. In addition, among various image pickup devices, such as video cameras with interchangeable imaging lens units, copy machines, facsimile machines, and scanners, and electronic or electrical apparatuses including in the image pickup devices, the present invention may be applied to any apparatus in which dust that has adhered to a surface of an optical component needs to be removed.

Optical Apparatus

An optical apparatus according to an embodiment of the present invention will now be described. The optical apparatus according to the embodiment of the present invention includes a driving unit including a vibration wave driving device that serves as an ultrasonic motor.

Figure 11A:
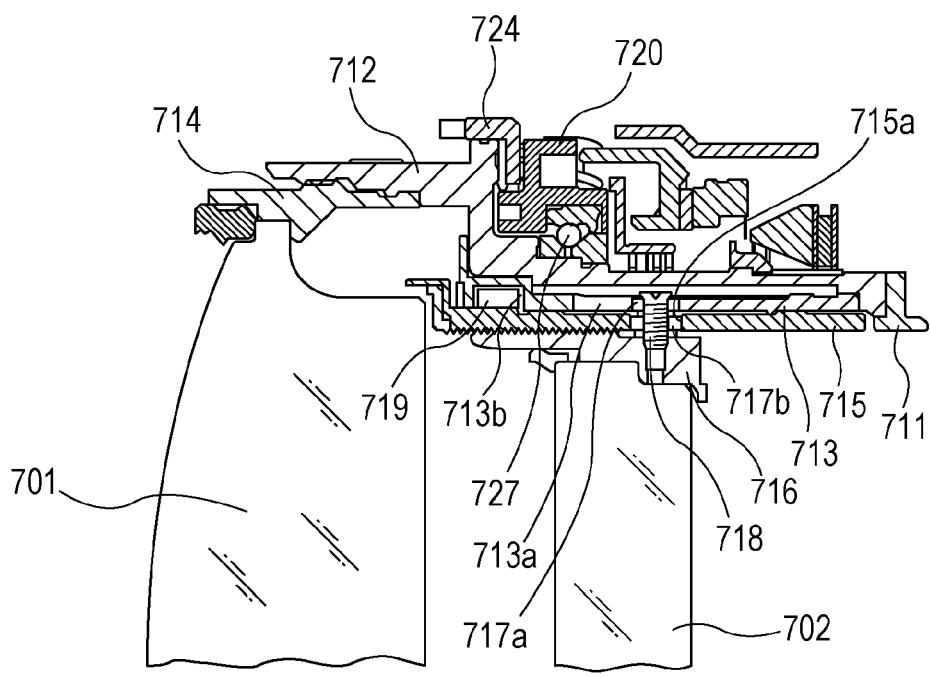
FIGS. 11A and 11B are sectional views of the main part of an interchangeable lens barrel of a single-lens reflex camera, which is an image pickup device according to an embodiment of the present invention.
Figure 11B:
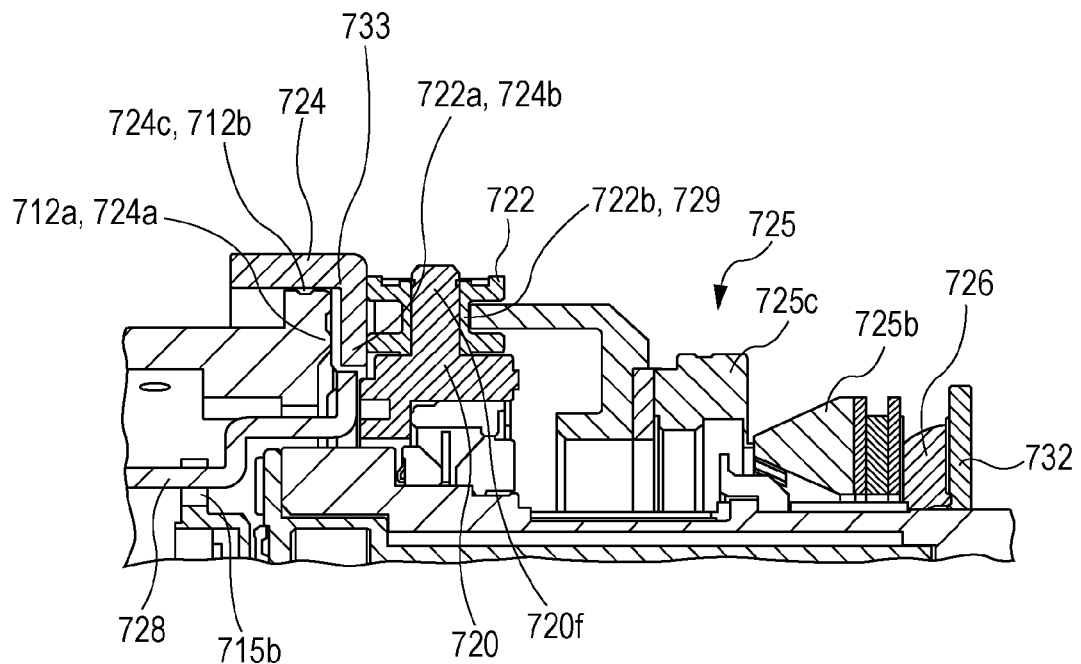
Figure 12:
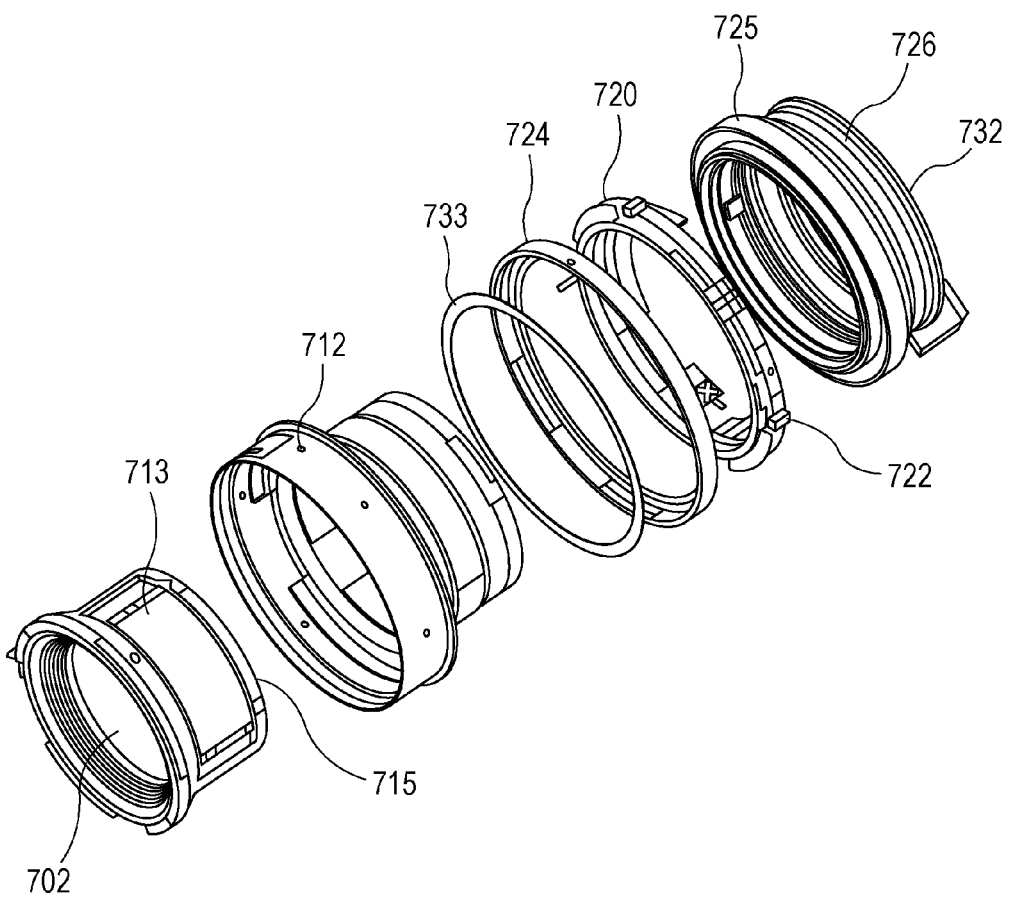
FIG. 12 is an exploded perspective view of the interchangeable lens barrel of the single-lens reflex camera, which is an image pickup device according to an embodiment of the present invention.

FIGS. 11A and 11B are sectional views of the main part of an interchangeable lens barrel of a single-lens reflex camera, which is an image pickup device according to an embodiment of the present invention. FIG. 12 is an exploded perspective view of the interchangeable lens barrel of the single-lens reflex camera, which is an image pickup device according to an embodiment of the present invention. A fixed barrel 712, a linear guide barrel 713, and a front-lens-group barrel 714 are fixed to a mount 711 used to attach the lens barrel to the camera. These components are fixed in the interchangeable lens barrel.

A linear guide groove 713a for a focus lens 702 is formed in the linear guide barrel 713 so as to extend in an optical axis direction. Cam rollers 717a and 717b that project in a radially outward direction are fixed to a rear-lens-group barrel 716, which holds the focus lens 702, with a shaft screw 718. The cam roller 717a is fitted in the linear guide groove 713a.

A cam ring 715 is rotatably fitted to an inner peripheral portion of the linear guide barrel 713. A roller 719 fixed to the cam ring 715 is fitted to an annular groove 713b formed in the linear guide barrel 713, so that the linear guide barrel 713 and the cam ring 715 cannot move relative to each other in the optical axis direction. A cam groove 715a for the focus lens 702 is formed in the cam ring 715, and the cam roller 717b is fitted in the cam groove 715a.

A rotation transmitting ring 720 is provided on the outer periphery of the fixed barrel 712. The rotation transmitting ring 720 is held by a ball race 727 so as to be rotatable relative to the fixed barrel 712 at a fixed position. The rotation transmitting ring 720 is provided with rollers 722 that are rotatably retained by shafts 720f that extend radially from the rotation transmitting ring 720. A large-diameter portion 722a of each roller 722 is in contact with a mount-side end surface 724b of a manual focus ring 724. A small-diameter portion 722b of each roller 722 is in contact with a joint member 729. Six rollers 722 are arranged along the outer periphery of the rotation transmitting ring 720 with constant intervals therebetween, and each roller 722 has the above-described configuration.

A low-friction sheet (washer member) 733 is arranged on a radially inner portion of the manual focus ring 724, and is interposed between a mount-side end surface 712a of the fixed barrel 712 and a front-side end surface 724a of the manual focus ring 724. The radially outer surface of the low-friction sheet 733 is ring-shaped and is fitted to a radially inner portion 724c of the manual focus ring 724 in the radial direction. The radially inner portion 724c of the manual focus ring 724 is fitted to a radially outer portion 712b of the fixed barrel 712 in the radial direction. The low-friction sheet 733 serves to reduce the friction in a rotary ring mechanism in which the manual focus ring 724 is rotated around the optical axis relative to the fixed barrel 712.

The large-diameter portion 722a of each roller 722 and a mount-side end surface 724b of the manual focus ring 724 are in contact with each other while a pressing force is applied therebetween owing to a pressing force of a wave washer 726 that presses an ultrasonic motor 725 toward the front side of the lens. Similarly, the small-diameter portion 722b of each roller 722 and the joint member 729 are in contact with each other while an appropriate pressing force is applied therebetween by the pressing force of the wave washer 726 that presses the ultrasonic motor 725 toward the front side of the lens. The wave washer 726 is prevented from moving toward the mount side by a washer 732 that is bayonet-mounted to the fixed barrel 712. The spring force (urging force) generated by the wave washer 726 is transmitted to the ultrasonic motor 725 and then to the rollers 722, and serves as a pressing force that presses the manual focus ring 724 against the mount-side end surface 712a of the fixed barrel 712. Thus, the manual focus ring 724 is assembled while being pressed against the mount-side end surface 712a of the fixed barrel 712 with the low-friction sheet 733 interposed therebetween.

Accordingly, when the ultrasonic motor 725 is rotated with respect to the fixed barrel 712 by a control unit (not shown), since the joint member 729 is in frictional contact with the small-diameter portions 722b of the rollers 722, the rollers 722 rotate around the respective shafts 720f. When the rollers 722 rotate around the respective shafts 720f, the rotation transmitting ring 720 is rotated around the optical axis (automatic focusing operation).

Also, when a rotation force around the optical axis is applied to the manual focus ring 724 from a manual operation input unit (not shown), since the mount-side end surface 724b of the manual focus ring 724 is in pressure-contact with the large-diameter portions 722a of the rollers 722, the rollers 722 rotate around the respective shafts 720f. When the large-diameter portions 722a of the rollers 722 rotate around the respective shafts 720f, the rotation transmitting ring 720 is rotated around the optical axis. At this time, the ultrasonic motor 725 does not rotate owing to a frictional retention force applied between a rotor 725c and a stator 725b (manual focusing operation).

Two focus keys 728 are attached to the rotation transmitting ring 720 at positions where the focus keys 728 oppose each other, and are fitted in notches 715b formed in a front end portion of the cam ring 715. Therefore, when the rotation transmitting ring 720 is rotated around the optical axis in the automatic focusing operation or the manual focusing operation, the rotation force is transmitted to the cam ring 715 through the focus keys 728. When the cam ring 715 is rotated around the optical axis, the rear-lens-group barrel 716, which is prevented from rotating by the cam roller 717a and the linear guide groove 713a, is caused to move back and forth along the cam groove 715a in the cam ring 715 by the cam roller 717b. Thus, the focus lens 702 is driven and the focusing operation is performed.

Although an interchangeable lens barrel of a single-lens reflex camera has been described as an optical apparatus according to an embodiment of the present invention, the type of the camera is not limited, and the camera may instead be a compact camera, an electronic still camera, or a camera mounted in a portable information terminal. The present invention may be applied to any optical apparatus in which a driving unit includes an ultrasonic motor.

Liquid Discharge Head

A liquid discharge head will now be described as a vibration wave driving device according to an embodiment of the present invention.

A vibration wave driving device according to an embodiment of the present invention that serves as a liquid discharge head includes at least a liquid chamber having a vibrating unit in which the piezoelectric element is arranged and a discharge port that communicates with the liquid chamber.

Figure 13A:
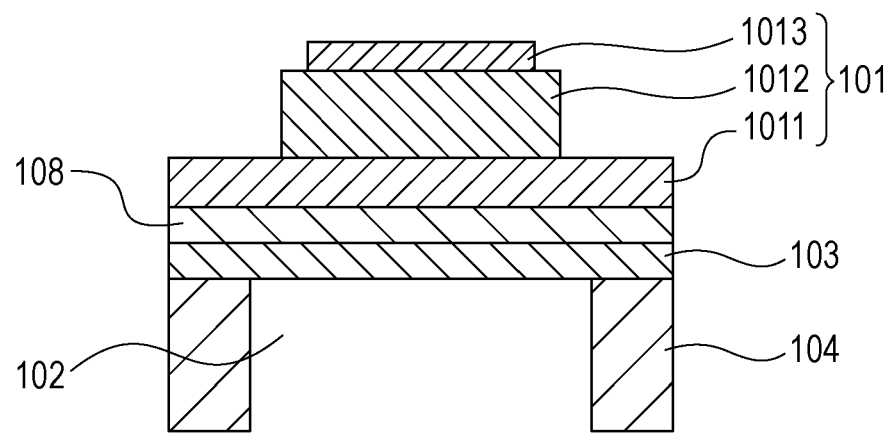
FIGS. 13A and 13B are schematic diagrams illustrating the structure of a liquid discharge head included in a liquid discharge device according to an embodiment of the present invention.
Figure 13B:
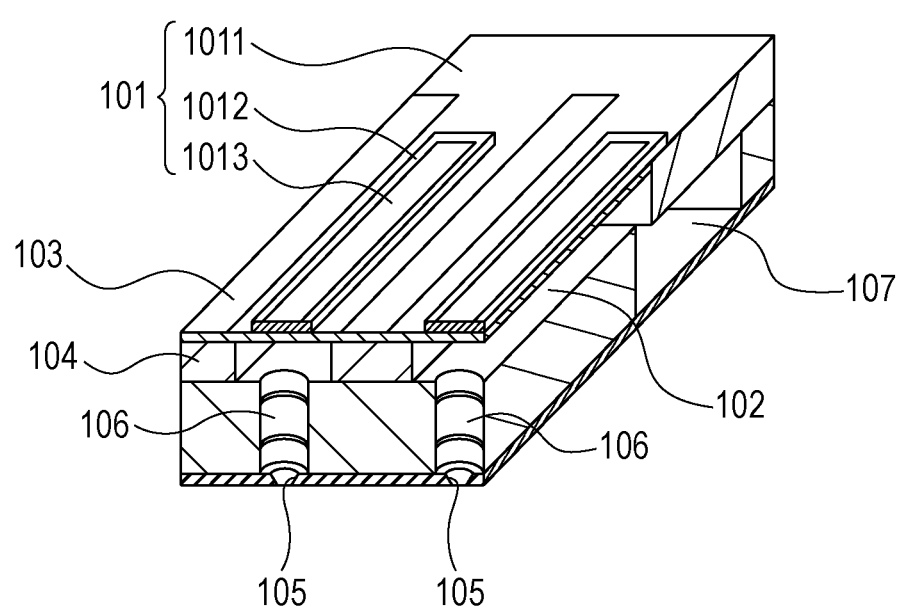

FIGS. 13A and 13B are schematic diagrams illustrating the structure of a liquid discharge head according to an embodiment. As illustrated in FIGS. 13A and 13B, the liquid discharge head includes piezoelectric elements 101. Each piezoelectric element 101 includes at least a first electrode 1011, a piezoelectric material 1012, and a second electrode 1013. As illustrated in FIG. 13B, the piezoelectric materials 1012 are patterned as necessary.

FIG. 13B is a schematic diagram illustrating the liquid discharge head. The liquid discharge head includes discharge ports 105, individual liquid chambers 102, communication holes 106 that connect the individual liquid chambers 102 to the respective discharge ports 105, liquid chamber partition walls 104, a common liquid chamber 107, a vibrating plate 103, and the piezoelectric element 101s. Although the piezoelectric elements 101 illustrated in FIGS. 13A and 13B have a rectangular shape, the piezoelectric element 101 may instead have a shape other than a rectangular shape, such as an elliptical shape, a circular shape, or a parallelogram shape. In general, the shape of the piezoelectric materials 1012 follows the shape of the individual liquid chambers 102.

A part of the liquid discharge head according to the embodiment of the present invention around each piezoelectric element 101 will now be described in detail with reference to FIG. 13A. FIG. 13A is a sectional view of each of the piezoelectric elements 101 shown in FIG. 13B taken in the width direction. Although each piezoelectric element 101 has a rectangular shape in cross section, the cross-sectional shape of each piezoelectric element 101 may instead be a trapezoidal shape or an inverted trapezoidal shape.

In FIG. 13A, the first electrode 1011 serves as a lower electrode and the second electrode 1013 serves as an upper electrode. However, the arrangement of the first electrode 1011 and the second electrode 1013 is not limited to this. For example, the first electrode 1011 may be used either as the lower electrode or the upper electrode. Similarly, the second electrode 1013 may be used either as the upper electrode or the lower electrode. A buffer layer 108 may be provided between the vibrating plate 103 and the lower electrode. The differences in names are derived from the manufacturing method of the device, and effects of the present invention can be achieved in any case.

In the liquid discharge head, the vibrating plate 103 is moved in the vertical direction in response to expansion and contraction of the piezoelectric materials 1012, thereby applying pressures to the liquid contained in the individual liquid chambers 102. As a result, liquid is ejected from the discharge ports 105. The liquid discharge head according to the embodiment of the present invention can be used in a printer or in a process of manufacturing an electronic device.

The thickness of the vibrating plate 103 can be 1.0 μm or more and 15 μm or less, and is preferably 1.5 μm or more and 8 μm or less. The material of the vibrating plate 103 is not particularly limited. For example, the material may be Si. In such a case, the vibrating plate 103 may be made of Si doped with boron or phosphorus. The buffer layer 108 and the electrode layer provided on the vibrating plate 103 may be formed as a part of the vibrating plate 103. The thickness of the buffer layer 108 can be 5 nm or more and 300 nm or less, and is preferably 10 nm or more and 200 nm or less. The size of the discharge ports 105 is 5 μm or more and 40 μm or less in terms of diameter of a circle. The discharge ports 105 may have a circular shape, a star shape, a rectangular shape, or a triangular shape.

Liquid Discharge Device

A liquid discharge device according to an embodiment of the present invention includes a mounting portion for a transfer member and the above-described vibration wave driving device.

A liquid discharge device according to an embodiment of the present invention will now be described. A liquid discharge device according to an embodiment of the present invention includes a mounting portion for a transfer member, a conveying unit for a recording medium, and a vibration wave driving device that functions as a liquid discharge head.

Figure 14:
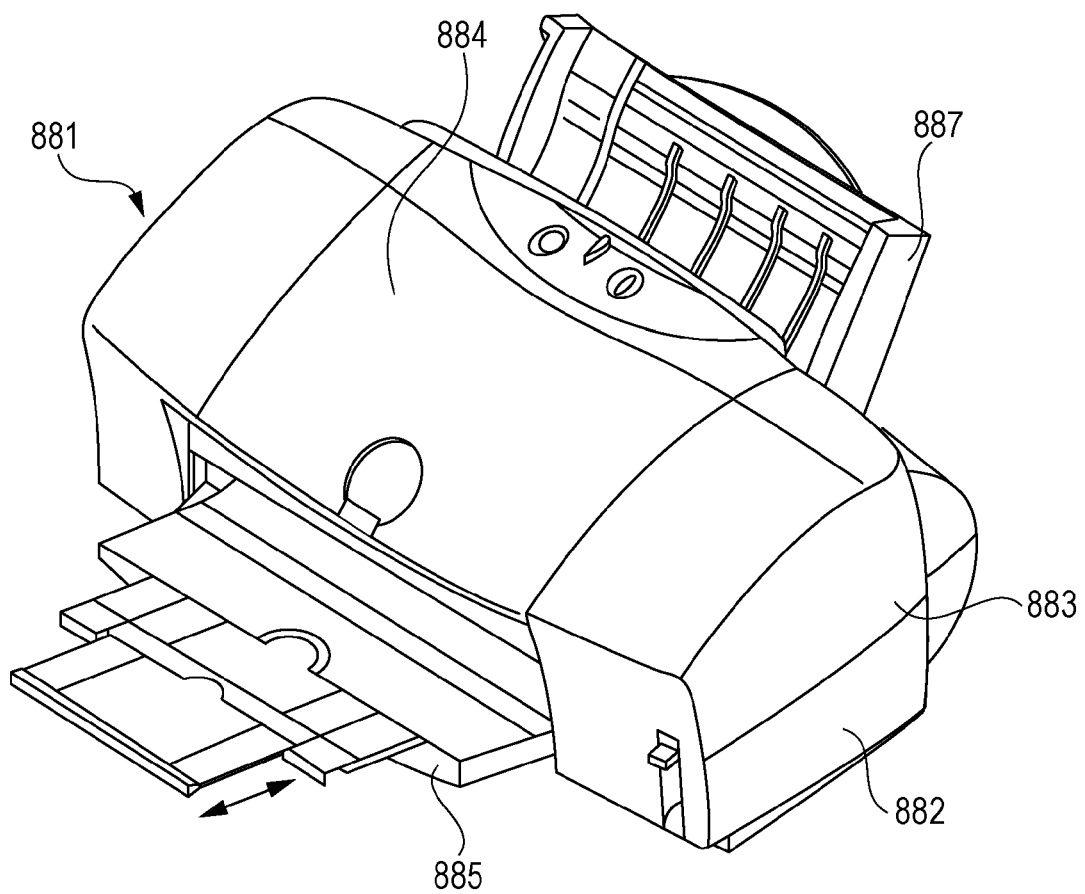
FIG. 14 is a schematic diagram illustrating a liquid discharge device according to an embodiment of the present invention.
Figure 15:
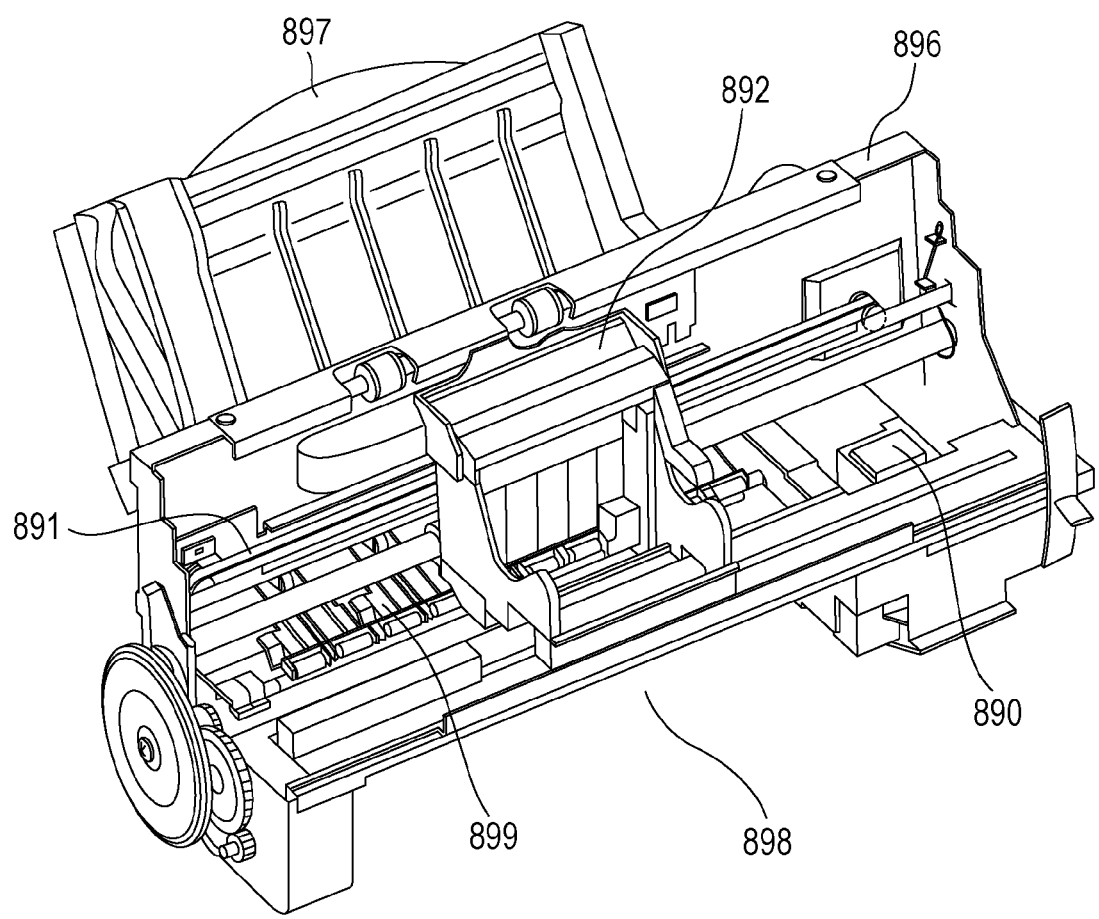
FIG. 15 is a schematic diagram illustrating the liquid discharge device according to the embodiment of the present invention.

FIGS. 14 and 15 illustrate an inkjet recording apparatus as a liquid discharge device according to an embodiment of the present invention. FIG. 14 illustrates a liquid discharge device (inkjet recording apparatus) 881, and FIG. 15 illustrates the liquid discharge device 881 in a state such that outer casing members 882 to 885 and 887 thereof are removed. The inkjet recording apparatus 881 includes an automatic feeder 897 that automatically feeds a recording sheet, which serves as a recording medium, into an apparatus body 896. The inkjet recording apparatus 881 also includes a conveying unit 899 that guides the recording sheet fed from the automatic feeder 897 to a predetermined recording position and then to a discharge slot 898 from the recording position; a recording unit 891 that performs recording on the recording sheet transferred to the recording position; and a recovery unit 890 that performs a recovery process for the recording unit 891. The recording unit 891 includes a carriage 892 that houses a liquid discharge head according to an embodiment of the present invention and that is reciprocated along a rail.

In the inkjet recording apparatus, the carriage 892 is moved along the rail in response to an electric signal transmitted form a computer. When a drive voltage is applied to the electrodes that sandwich the piezoelectric materials, the piezoelectric materials are displaced. Owing to the displacements of the piezoelectric materials, the individual liquid chambers 102 are pressurized by the vibrating plate 103 illustrated in FIG. 13B, and ink is discharged from the discharge ports 105. Thus, a printing process is performed.

The liquid discharge device according to the embodiment of the present invention is capable of discharging liquid uniformly at a high speed, and the size of the apparatus can be reduced.

Although a printer has been described as an example, the liquid discharge device according to an embodiment of the present invention may instead be an inkjet printing apparatus, such as a facsimile machine, a multifunction machine, or a copy machine, or an industrial liquid discharge device.

Electronic Apparatus

An electronic apparatus according to an embodiment of the present invention includes the above-described vibration wave driving device.

An electronic apparatus according to an embodiment of the present invention will now be described. An electronic apparatus according to an embodiment of the present invention includes a piezoelectric acoustic component including the above-described piezoelectric element or the above-described multilayered piezoelectric element. The piezoelectric acoustic component may be, for example, a speaker, a buzzer, a microphone, or a surface acoustic wave (SAW).

Figure 16:
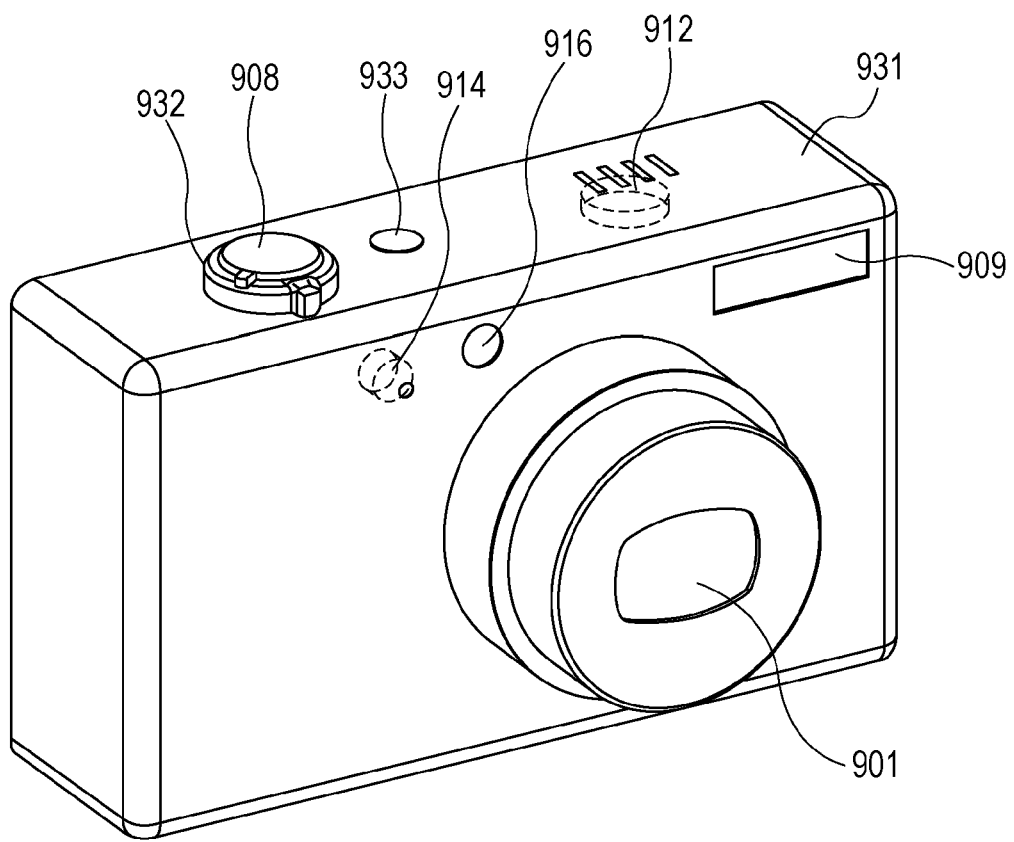
FIG. 16 is a schematic diagram illustrating an electronic apparatus according to an embodiment of the present invention.

FIG. 16 is a perspective view of a digital camera, which is an electronic apparatus according to an embodiment of the present invention, viewed from the front of a main body 931. An optical device 901, a microphone 914, a strobe light unit 909, and an auxiliary light unit 916 are arranged at the front of the main body 931. The microphone 914 is located inside the main body, and is therefore shown by the broken line. A hole for collecting sound from the outside is formed in front of the microphone 914.

A power button 933, a speaker 912, a zoom lever 932, and a release button 908 for performing a focusing operation are provided at the top of the main body 931. The speaker 912 is located inside the main body 931, and is therefore shown by the broken line. Holes for emitting sound to the outside are formed above the speaker 912.

At least one of the microphone 914, speaker 912, and a SAW device is a piezoelectric acoustic component according to an embodiment of the present invention.

Although a digital camera has been described as an electronic apparatus according to an embodiment the present invention, the present invention may also be applied to electronic apparatuses including various types of piezoelectric acoustic components, such as sound-reproducing apparatuses, sound-recording apparatuses, mobile phones, and information terminals.

Other Embodiments

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-279477, filed Dec. 21, 2012, which is hereby incorporated by reference herein in its entirety.

INDUSTRIAL APPLICABILITY

The present invention is applicable to apparatuses driven by vibration waves, such as ultrasonic motors and dust removing devices.

REFERENCE SIGNS LIST

P piezoelectric element
C capacitor
1 first electrode
2 piezoelectric material
3 second electrode
4 vibration wave driving device
5 ultrasonic motor
101 piezoelectric element
102 individual liquid chamber
103 vibrating plate
104 liquid chamber partition wall
105 discharge port
106 communication hole
107 common liquid chamber
108 buffer layer
1011 first electrode
1012 piezoelectric material
1013 second electrode
201 vibrator
202 rotor
203 output shaft
204 vibrator
205 rotor
206 spring
2011 elastic ring
2012 piezoelectric element
2013 organic adhesive
2041 metal elastic member
2042 multilayered piezoelectric element
310 dust removing device
330 piezoelectric element
320 vibrating plate
330 piezoelectric element
331 piezoelectric material
332 first electrode
333 second electrode
336 first electrode surface
337 second electrode surface
310 dust removing device
320 vibrating plate
330 piezoelectric element
51 first electrode
53 second electrode
54 piezoelectric material layer
55 inner electrode
501 first electrode
503 second electrode
504 piezoelectric material layer
505 inner electrode
506a outer electrode
506b outer electrode
601 camera body
602 mount
605 mirror box
606 main mirror
200 shutter unit
300 main body chassis
400 image pickup unit
701 front lens unit 702 rear lens unit (focus lens)
711 mount
712 fixed barrel
713 linear guide barrel
714 front-lens-group barrel
715 cam ring
716 rear-lens-group barrel
717 cam roller
718 shaft screw
719 roller
720 rotation transmitting ring
722 roller
724 manual focus ring
725 ultrasonic motor
726 wave washer
727 ball race
728 focus key
729 joint member
732 washer
733 low-friction sheet
881 liquid discharge device
882 outer casing member
883 outer casing member
884 outer casing member
885 outer casing member
887 outer casing member
890 recovery unit
891 recording unit
892 carriage
896 apparatus body
897 automatic feeder
898 discharge slot
899 conveying unit
901 optical device
908 release button
909 strobe light unit
912 speaker
914 microphone
916 auxiliary light unit
931 main body
932 zoom lever
933 power button

The invention claimed is:

1. A vibration wave driving device that generates a vibration wave by applying an AC voltage to a piezoelectric element, the vibration wave driving device comprising:
the piezoelectric element including a piezoelectric material and an electrode; and
a capacitor that is connected in parallel to the piezoelectric element,
wherein the piezoelectric material contains a perovskite-type metal oxide as a main component, the perovskite-type metal oxide being represented by general formula (1)

$$(Ba_{1-x}Ca_x)_a(Ti_{1-y}Zr_y)O_3 \quad (1)$$

where $1.00 \leq a \leq 1.01$, $0.02 \leq x \leq 0.30$, $0.020 \leq y \leq 0.095$, and $y \leq x$,
wherein the perovskite-type metal oxide contains Mn, the content of Mn in 100 parts by weight of the perovskite-type metal oxide being 0.02 parts by weight or more and 0.40 parts by weight or less on a metal basis,
wherein the capacitor contains Ba, Ca, Ti, and Zr as main components, and
wherein, when a maximum value of a relative dielectric constant of the piezoelectric material in a temperature range of $-60°$ C. to $+50°$ C. is $\in$(Pmax), a temperature at the maximum value of the relative dielectric constant of the piezoelectric material is T$\in$(Pmax), a relative dielectric constant of the capacitor at the temperature T$\in$(Pmax) is $\in$(Cc), a maximum value of the relative dielectric constant of the capacitor in the temperature range of $-60°$ C. to $+50°$ C. is $\in$(Cmax), and a temperature at the maximum value of the relative dielectric constant of the capacitor is T$\in$(Cmax), $20[° C.] \leq T\in(Cmax) - T\in(Pmax) \leq 75[° C.]$ and $0.50 \leq \in(Cc)/\in(Cmax) \leq 0.80$ are satisfied.

2. The vibration wave driving device according to claim 1, wherein the piezoelectric material satisfies $(11x/14) - 0.118 \leq y \leq (11x/14) - 0.037$ in general formula (1).

3. The vibration wave driving device according to claim 1, wherein the capacitor contains a metal oxide as a main component, the metal oxide being represented by general formula (2)

$$(Ba_{1-x'}Ca_{x'})_{a'}(Ti_{1-y'}Zr_{y'})O_3 \quad (2)$$

where $0.9 \leq a' \leq 1.1$, $0 \leq x'$, $0 \leq y' \leq 0.197$, and $(11x'/14) - 0.037 \leq y' \leq (11x'/14) + 0.04$.

4. The vibration wave driving device according to claim 1, further comprising a vibrating member that is in contact with the piezoelectric element.

5. The vibration wave driving device according to claim 4, further comprising a rotor that is in contact with the vibrating member.

6. An image pickup device comprising at least:
the vibration wave driving device according to claim 1; and
an image pickup element unit,
wherein the vibration wave driving device includes a vibrating body provided on a light-receiving-surface side of the image pickup element unit.

7. An optical apparatus comprising:
a driving unit including the vibration wave driving device according to claim 1.

8. A liquid discharge device comprising:
a mounting unit for a transfer member; and
the vibration wave driving device according to claim 1.

9. An electronic apparatus comprising:
ration wave driving device according to claim 1.

* * * * *